(12) United States Patent
Kim et al.

(10) Patent No.: US 8,476,763 B2
(45) Date of Patent: Jul. 2, 2013

(54) SEMICONDUCTOR DEVICE CONDUCTIVE PATTERN STRUCTURES INCLUDING DUMMY CONDUCTIVE PATTERNS

(75) Inventors: Hei-Seung Kim, Suwon-si (KR); In-Sun Park, Seoul (KR); Gil-Heyun Choi, Seoul (KR); Ji-Soon Park, Suwon-si (KR); Jong-Myeong Lee, Seongnam-si (KR); Jong-Won Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 13/237,514

(22) Filed: Sep. 20, 2011

(65) Prior Publication Data

US 2012/0193792 A1    Aug. 2, 2012

(30) Foreign Application Priority Data

Jan. 31, 2011    (KR) .................. 10-2011-0009342

(51) Int. Cl.
*H01L 23/48* (2006.01)
*H01L 21/4763* (2006.01)
*H01L 27/10* (2006.01)
*H01L 21/3205* (2006.01)
*H01L 21/768* (2006.01)
*G06F 17/50* (2006.01)

(52) U.S. Cl.
USPC ........... 257/741; 257/751; 257/773; 257/774; 257/776; 257/E23.014; 257/E21.577; 257/E23.145; 257/E23.151; 257/E23.152; 257/E23.168; 257/E23.175

(58) Field of Classification Search
None
See application file for complete search history.

(56) References Cited

U.S. PATENT DOCUMENTS

| 2002/0100975 | A1  | 8/2002  | Kanda |
|---|---|---|---|
| 2007/0063223 | A1* | 3/2007  | Choi ............................ 257/202 |
| 2007/0164432 | A1  | 7/2007  | Wakisaka et al. |
| 2008/0036095 | A1* | 2/2008  | Suzuki ......................... 257/776 |
| 2012/0280391 | A1* | 11/2012 | Kim et al. .................... 257/751 |

FOREIGN PATENT DOCUMENTS

| KR | 10-2010-0006607 A | 1/2010 |
|---|---|---|
| WO | WO 2010/005167 A2 | 1/2010 |

* cited by examiner

*Primary Examiner* — Thao Le
*Assistant Examiner* — Brian B Lee
(74) *Attorney, Agent, or Firm* — Myers Bigel Sibley & Sajovec, P.A.

(57) ABSTRACT

Methods of forming conductive pattern structures form an insulating interlayer on a substrate that is partially etched to form a first trench extending to both end portions of a cell block. The insulating interlayer is also partially etched to form a second trench adjacent to the first trench, and a third trench extending to the both end portions of the cell block. The second trench has a disconnected shape at a middle portion of the cell block. A seed copper layer is formed on the insulating interlayer. Inner portions of the first, second and third trenches are electroplated with a copper layer. The copper layer is polished to expose the insulating interlayer to form first and second conductive patterns in the first and second trenches, respectively, and a first dummy conductive pattern in the third trench. Related conductive pattern structures are also described.

8 Claims, 31 Drawing Sheets

SEMICONDUCTOR DEVICE CONDUCTIVE PATTERN STRUCTURES INCLUDING DUMMY CONDUCTIVE PATTERNS

CROSS REFERENCE TO RELATED APPLICATION

This U.S. non-provisional application claims priority under 35 USC §119 to Korean Patent Application No. 10-2011-0009342, filed on Jan. 31, 2011, the entire contents of which are incorporated herein by reference.

BACKGROUND

Various embodiments described herein relate to conductive pattern structures of semiconductor devices and methods of manufacturing the same. More particularly, various embodiments described herein relate to conductive pattern structures of semiconductor devices including a copper wiring formed by an electroplating process and methods of manufacturing the same.

In order to manufacture highly integrated semiconductor devices, a material having a low resistance such as copper may be used to form a wiring in the semiconductor devices. Generally, the copper wiring may be formed by filling up a groove with copper through an electroplating process.

SUMMARY

According to some embodiments, in methods of forming a conductive pattern structure of a semiconductor device, an insulating layer, such as an insulating interlayer, is formed on a substrate including a first region and a second region. The insulating layer is partially etched to form a first trench extending in a first direction to opposing end portions of a cell block of the semiconductor device on the substrate in the first region, to form a second trench adjacent to the first trench and extending in the first direction, and to form a third trench extending in the first direction to the opposing end portions of the cell block. The second trench has a disconnected shape at a middle portion of the cell block so that it does not extend to both end portions of the cell block between the opposing end portions of the cell block. A seed copper layer is formed on a surface portion of the insulating layer including the first, second and third trenches. Inner portions of the first, second and third trenches are electroplated with a copper layer. The copper layer is removed, such as by polishing, sufficiently to expose an upper surface portion of the insulating layer to form a first conductive pattern in the first trench, to form a second conductive pattern in the second trench and to form a first dummy conductive pattern in the third trench.

In some embodiments, a barrier metal layer may be formed between the insulating layer including the first to third trenches and the seed copper layer.

In some embodiments, the electroplating may be performed by placing the substrate into a solution including copper and then applying a voltage to an edge portion of the substrate to flow a current through the seed copper layer and to form the copper layer.

In some embodiments, the second trench may have a greater inner width than that of the first and third trenches.

In some embodiments, an electroplating current may be applied through the seed copper layer formed in the third trench to generate the electroplating current and an electric field for performing the electroplating of the inner portion of the second trench with the copper layer while performing the electroplating.

In some embodiments, the insulating layer may also be etched to form a fourth trench penetrating a sidewall of the third trench and extending in the first direction, and a second dummy conductive pattern may be formed in the fourth trench. The second dummy conductive pattern may make an electric connection with the first dummy conductive pattern.

In some embodiments, the fourth trench may be provided in a row with the second trench.

In some embodiments, the second trench may be provided between the first and third trenches.

In some embodiments, the first and third trenches may be formed by performing a photolithography one time.

According to other embodiments, a conductive pattern structure of a semiconductor device includes an insulating layer, such as an insulating interlayer, on a substrate including a first region and a second region. A first conductive pattern is provided in the insulating layer in the first region and extends in a first direction to opposing end portions of a cell block. A second conductive pattern is provided in the insulating layer in the second region and adjacent to the first conductive pattern. The second conductive pattern has a shape disconnected at a middle of the cell block, so that it does not extend to both end portions of the cell block between the opposing end portions of the cell block, and extends in the first direction. A first dummy conductive pattern is adjacent to the second conductive pattern and extends in the first direction to the opposing end portions of the cell block In some embodiments, the second conductive pattern may be provided between the first dummy conductive pattern and the first conductive pattern.

In some embodiments, a gap between the second conductive pattern and the first dummy conductive pattern and a gap between the second conductive pattern and the first conductive pattern may be the same size.

In some embodiments, the first and second conductive patterns and the first dummy conductive pattern may include copper.

In some embodiments, the first conductive pattern and the first dummy conductive pattern may have the same line width.

In some embodiments, a second dummy conductive pattern having a line shape and arranged in a row with the second conductive pattern may be further included in the conductive pattern structure. The second dummy conductive pattern may make an electric connection with the first dummy conductive pattern.

According to other embodiments, a conductive pattern structure of a semiconductor device includes a plurality of closely spaced-apart signal lines that extend in parallel from a first end of the semiconductor device to a second end of the semiconductor device that is opposite the first end. A reference voltage pad is provided that is wider than one of the closely spaced-apart signal lines and that extends from the first end of the semiconductor device to a middle portion of the semiconductor device but not to the second end of the semiconductor device. A dummy conductive line is adjacent the reference voltage pad extends from the first end of the semiconductor device to the second end of the semiconductor device.

In some embodiments, the dummy conductive line is a first dummy conductive line, and the conductive pattern structure further comprises a plurality of closely spaced-apart second dummy conductive lines that extend in parallel from the second end of the semiconductor device towards the reference voltage pad. In some embodiments, at least one of the second dummy conductive lines is electrically connected to the first dummy conductive line. In other embodiments, a second dummy conductive line is provided that extends orthogonally from the first dummy conductive line adjacent the reference voltage pad.

In some embodiments, the dummy conductive line is between the plurality of closely spaced-apart signal lines and the reference voltage pad.

In other embodiments, the signal lines, the first dummy conductive line and the second dummy conductive lines are of equal widths and are equally spaced apart.

In still other embodiments, a connector dummy conductive line extends from the first dummy conductive line across the second dummy conductive lines. Finally, in some embodiments, the signal lines, the reference voltage pad, the first dummy conductive line and the second dummy conductive lines comprise copper.

As explained above, according to some embodiments, a sufficient amount of current may be supplied to a whole region of a substrate and copper wirings having a uniform thickness may be formed. In addition, when forming the copper wirings having different widths, generation of voids may be reduced or eliminated in a pattern having a wider width, and a groove may be filled up with a sufficient amount of copper. Accordingly, generation of operating defects of semiconductor devices due to wiring defects may be reduced or eliminated.

BRIEF DESCRIPTION OF THE DRAWINGS

Various embodiments will be more clearly understood from the following detailed description taken in conjunction with the accompanying drawings. FIGS. 1 to 36 represent various embodiments as described herein.

FIG. 1 is a cross-sectional view illustrating a conductive pattern structure in accordance with first embodiments described herein.

FIG. 2 is a plan view of the conductive pattern structure illustrated in FIG. 1.

FIGS. 3 to 7 are a plan view and cross-sectional views for explaining methods of manufacturing the conductive pattern structure illustrated in FIGS. 1 and 2.

FIG. 9 is a cross-sectional view of a conductive pattern structure in accordance with second embodiments described herein.

FIG. 10 is a plan view of the conductive pattern structure illustrated in FIG. 9.

FIGS. 11 to 16 are a plan view and cross-sectional views for explaining methods of manufacturing the conductive pattern structure illustrated in FIGS. 9 and 10.

FIG. 17 illustrates a NAND flash memory device in accordance with third embodiments described herein.

FIG. 18 illustrates a circuit diagram of the NAND flash memory device illustrated in FIG. 17.

FIGS. 19 to 26 are cross-sectional views for explaining methods of manufacturing the NAND flash memory device illustrated in FIGS. 17 and 18.

FIGS. 27 to 32 are plan views for explaining methods of manufacturing a metal wiring included in a NAND flash memory device.

FIGS. 33 to 35 are plan views of conductive pattern structures in accordance with other embodiments described herein.

FIG. 36 is a block diagram illustrating a system including a NAND flash memory in accordance with various embodiments described herein.

DETAILED DESCRIPTION OF THE EMBODIMENTS

Figure 1:
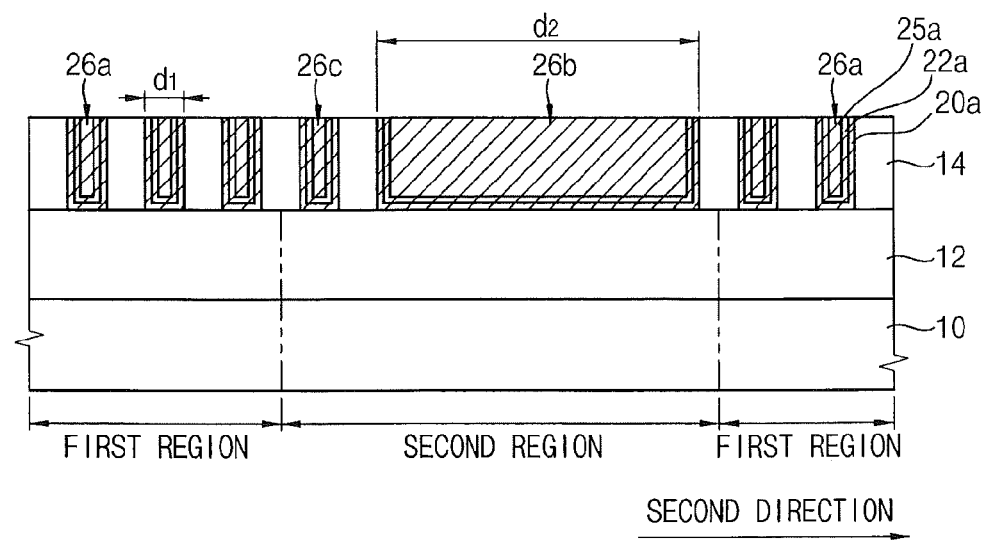

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which various embodiments described herein belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, various embodiments of conductive pattern structures and methods of manufacturing the same will be explained in detail. Various embodiments described herein may arise from recognition that when copper wiring is formed by the electroplating process, properties of the copper wiring may be largely dependent on electroplating variables, such as a current, a voltage, a kind of electrolyte solution, etc. When an insufficient amount of the current is supplied into each groove while performing the electroplating process, the groove may be insufficiently filled up with copper and formation of a desirable copper wiring may become difficult.

Particularly, when the copper wirings having two or more line widths and various kinds of shapes are formed in each region of a substrate, defects may be generated in a copper wiring having a relatively wide line width. In addition, when an electroplating current flows non-uniformly on a whole surface portion of the substrate and an amount of the applied electroplating current varies with respect to each region of the substrate, a thickness of the copper wiring may be decreased, voids may be generated and/or the copper wiring may be disconnected in a region receiving an insufficient amount of the electroplating current.

First Embodiments

Figure 2:
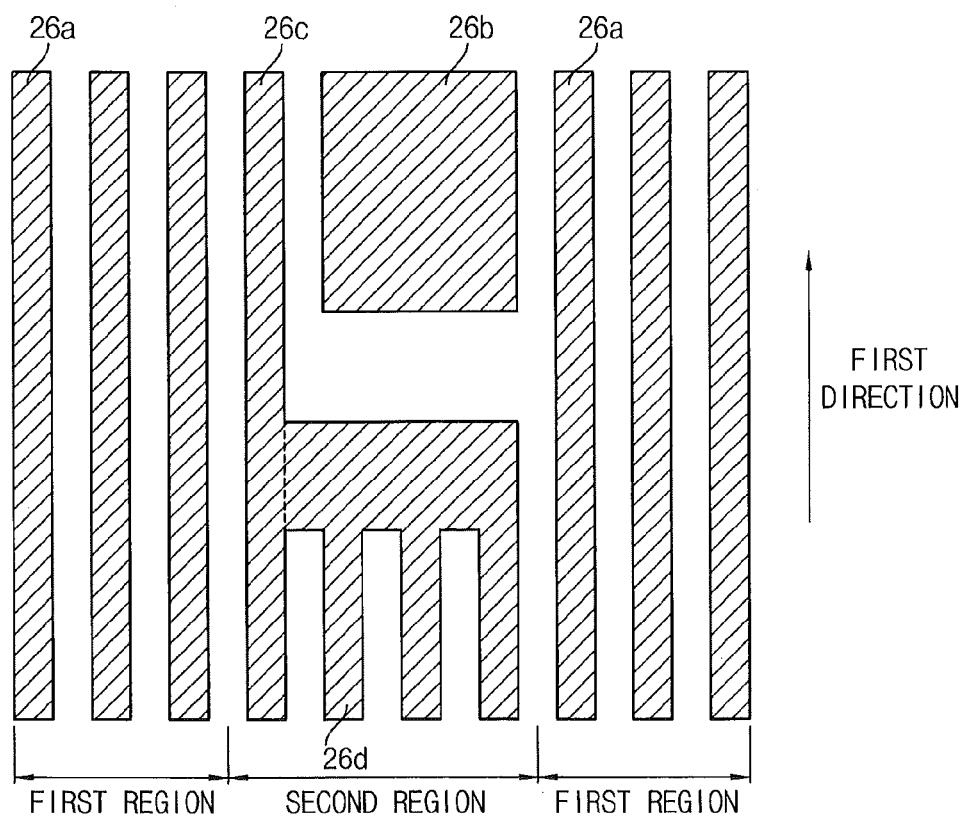

FIG. 1 is a cross-sectional view illustrating a conductive pattern structure in accordance with first embodiments described herein. FIG. 2 is a plan view of the conductive pattern structure illustrated in FIG. 1.

Referring to FIGS. 1 and 2, a substrate 10 including a first region and a second region may be provided. The substrate 10 includes a single element and/or compound semiconductor material in bulk wafer and/or layer form. On the substrate 10, switching devices such as transistors may be formed. A first insulating layer, such as a first insulating interlayer 12, covering the switching devices may be formed on the substrate 10.

On the first insulating interlayer 12 in the first and second regions, a first conductive pattern 26a, a second conductive pattern 26b, a first dummy conductive pattern 26c and a second dummy conductive pattern 26d including copper may be formed. The first and second conductive patterns 26a and 26b and the first and second dummy conductive patterns 26c and 26d may be formed by integrating a barrier metal layer pattern 20a, a seed copper layer pattern 22a and a copper layer pattern 25a.

On the first insulating interlayer 12 in the first region, the first conductive pattern 26a having a first line width d1 and being used as an effective and conductive wiring may be formed. The first conductive patterns may provide signal lines (including address, data and/or control signals) for the semiconductor device during operation thereof after manufacture. The first conductive pattern 26a may have a line shape extending in a first direction and the first conductive patterns 26a having the same line width may be formed repeatedly while keeping the same gap. Particularly, the first conductive pattern 26a may extend lengthwise in the first direction so as to make a continuous connection from an end portion to the opposing end portion of each cell block in a semiconductor device, shown as the top and bottom ends of FIG. 2. In addition, the first conductive pattern 26a may have the same line width of the first line width d1 and may be formed repeatedly with the same gap. The first conductive pattern 26a may include copper. A second insulating interlayer 14 may be formed to fill up the gaps between the first conductive patterns 26a.

On the first insulating interlayer 12 in the second region, the second conductive pattern 26b used as an effective and conductive wiring in a semiconductor device and having a second width d2 greater than the first width d1, and the first and second dummy conductive patterns 26c and 26d may be formed. The second conductive pattern 26b may provide a reference voltage (e.g., ground or power). The first and second dummy conductive patterns 26c and 26d may be excluded from using as an effective and conductive wiring in the semiconductor device. Stated differently, the dummy conductive patterns do not carry a signal or reference voltage during operation of the semiconductor device after manufacture. The second conductive pattern 26b, the first and second dummy conductive patterns 26c and 26d may include copper. The second insulating interlayer 14 may be formed to fill up the gaps between the second conductive patterns 26b and the first and second dummy conductive patterns 26c and 26d.

The second conductive pattern 26b may have a line shape extending in the first direction and may have a smaller length than the first conductive pattern 26a. That is, the second conductive pattern 26b does not fully extend from an end portion to the opposing end portion of each cell block, in contrast to the first conductive pattern 26a. The second width d2 may be greater than the first line width d1 and may have a width of three times or more than the first line width d1. The second conductive pattern 26b may be provided adjacent to the first conductive pattern 26a formed in the first region. Particularly, the first and second conductive patterns 26a and 26b may be spaced apart by the first line width d1.

The first dummy conductive pattern 26c may be provided with a gap from at least one sidewall of the second conductive pattern 26b and may have a line shape extending in the same direction as the extending direction of the second conductive pattern 26b. Particularly, the first dummy conductive pattern 26c may be provided while keeping a gap from one sidewall of the second conductive pattern 26b as illustrated in FIG. 2. In this case, one of the first dummy conductive patterns 26c may be provided for one of the second conductive patterns 26b. Alternatively, the first dummy conductive pattern 26c may be provided while keeping a gap from both sides of the second conductive pattern 26b. In this case, two of the first dummy conductive patterns 26c may be provided for one of the second conductive patterns 26b. When a number of the first dummy conductive patterns 26c increase, a horizontal region for forming the effective and conductive wiring may decrease. Accordingly, in some embodiments, one of the first dummy conductive patterns 26c may be provided while keeping the gap at one side of the second conductive pattern 26b.

The first dummy conductive pattern 26c may extend longer than the second conductive pattern 26b. Particularly, the first dummy conductive pattern 26c may extend lengthwise from one end portion to the opposing end portion of each cell block of the semiconductor device in the first direction. Further, the first dummy conductive pattern 26c may have a smaller line width than the second line width d2. Particularly, the first dummy conductive pattern 26c may have the first line width d1. The first dummy conductive pattern 26c and the second conductive pattern 26b may be spaced apart by the first line width d1.

That is, the gap between the second conductive pattern 26b and the first dummy conductive pattern 26c and the gap between the second conductive pattern 26b and the first conductive pattern 26a may be the same. In addition, the second conductive pattern 26b may be provided between the first dummy conductive pattern 26c and the first conductive pattern 26a.

The second dummy conductive pattern 26d may be provided in a row with the second conductive pattern 26b and may have a line shape in parallel with the first dummy conductive pattern 26c. The second dummy conductive pattern 26d may make a connection with the first during conductive pattern 26c at an end portion adjacent to the second conductive pattern 26b.

The first dummy conductive pattern 26c may be used as a conductive line for supplying a sufficient amount of current to form the second conductive pattern 26b to a desired height, while reducing or eliminating generation of voids. In order to form the first and second conductive patterns 26a and 26b and the first and second dummy conductive patterns 26c and 26d, a sufficient amount of electroplating current may be required to be supplied around a trench for forming the patterns by a voltage supplied from an edge portion of the substrate 10. Particularly, in order to form a second conductive pattern 26b having a wide line width, a large amount of copper may be required to fill up a trench for forming the second conductive pattern 26b. Accordingly, even larger amount of the current may be required to be supplied to the trench for forming the second conductive pattern 26b and even stronger electric field may be necessary.

Since the second conductive pattern 26b may not extend to both opposing edge portions of the cell block, an insufficient amount of the voltage from the edge portion of the substrate 10 may be supplied to the trench for forming the second conductive pattern 26b. Accordingly, the supplied electroplating current may be insufficient and the second conductive pattern 26b may be formed to have a thickness smaller than the desired thickness and/or voids may be frequently generated in the second conductive pattern 26b.

In various embodiments described herein, the second conductive pattern 26b may be provided between the first dummy conductive pattern 26c and the first conductive pattern 26a. The first dummy conductive pattern 26c and the first conductive pattern 26a may extend in the first direction so as to be connected from one end portion to the other end portion of each cell block.

The first dummy conductive pattern 26c may be provided while keeping a gap from at least one side of the second conductive pattern 26b. Accordingly, the voltage supplied from the edge portion of the substrate 10 may be applied along the first dummy conductive pattern 26c. In addition, a sufficiently high electric field may be applied around the second conductive pattern 26b by the first dummy conductive pattern 26c. The second conductive pattern 26b may be formed as a normal pattern having a sufficient thickness without generating any or excessive voids.

The first dummy conductive pattern 26c and the second dummy conductive pattern 26d may make an electric connection and so, a sufficient amount of the current may be also supplied to the second dummy conductive pattern 26d. The second dummy conductive pattern 26d may be also formed as a normal pattern having a sufficiently great thickness without generating any or excessive voids.

FIGS. 3 to 7 are a plan view and cross-sectional views for explaining methods of manufacturing the conductive pattern structure illustrated in FIGS. 1 and 2.

Figure 3:
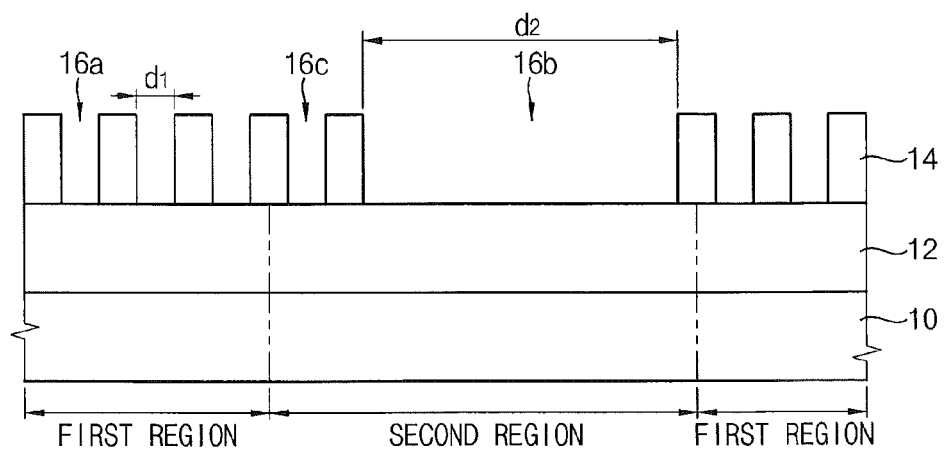
Figure 4:
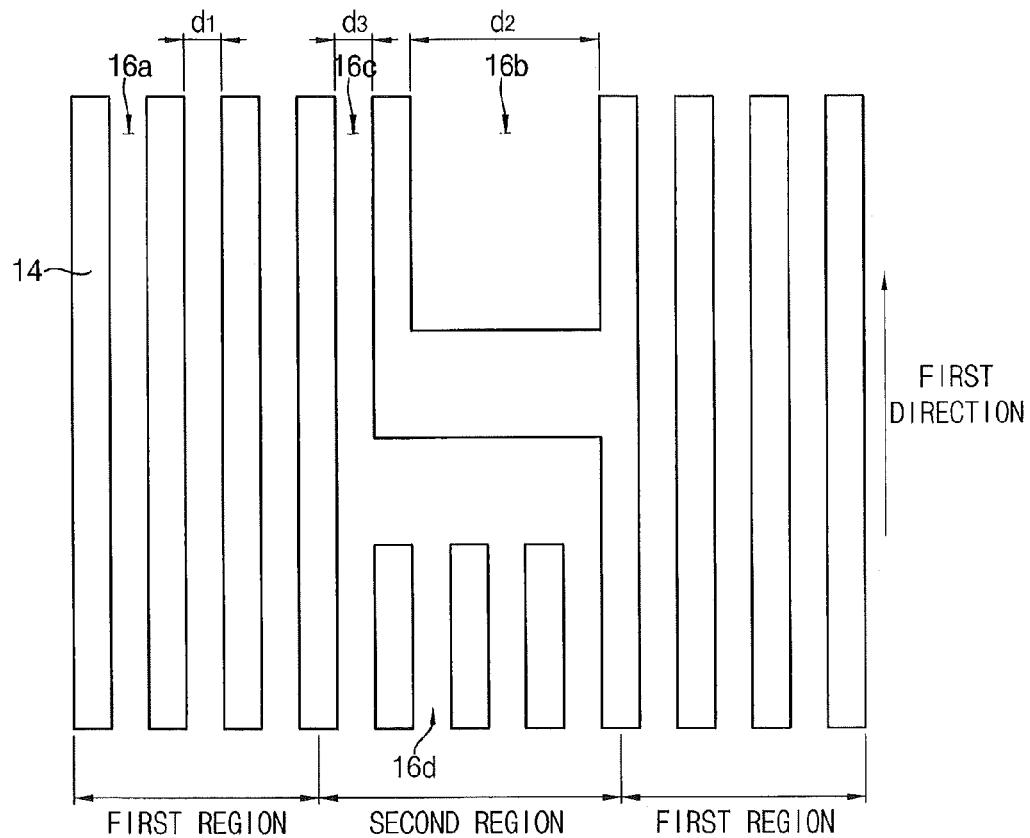

Referring to FIGS. 3 and 4, a substrate 10 including a first region and a second region may be provided. In the first region, first conductive patterns having a first line width and used as an effective and conductive wiring in a semiconductor device may be formed. In the second region, second conductive patterns having a second line width greater than the first line width and used as an effective and conductive wiring in a semiconductor device may be formed along with first and second dummy conductive patterns which may be ineffective wirings in a semiconductor device.

A first insulating interlayer 12 may be formed on the substrate 10. On the substrate 10, devices such as transistors constituting a semiconductor device may be formed. The first insulating interlayer 12 may be formed using an insulating material such as silicon oxide. The first insulating interlayer 12 may be formed so as to have a planar upper surface portion.

A second insulating interlayer 14 may be formed on the first insulating interlayer 12. First, second, third and fourth trenches 16a, 16b, 16c and 16d for forming conductive patterns may be formed by etching a portion of the second insulating interlayer 14 by means of photolithography. The shapes of the first to fourth trenches 16a~16d formed in each region may be explained in detail hereinafter.

A first trench 16a having a first width d1 and extending in a first direction may be formed in the second insulating interlayer 14 in the first region. The first trench 16a may have a line shape extending from an end portion to the opposite end portion of each cell block in the semiconductor device. The first trenches 16a may be repeatedly formed and spaced apart from each other by the first line width d1.

A second trench 16b having a second line width d2 greater than the first line width d1 and extending in the first direction may be formed in the second insulating interlayer adjacent to the first trenches in the second region. The second trench 16b may be disconnected from one end portion to the other end portion of each cell block different from the first trench 16a. Accordingly, the second trench 16b may have a smaller length than the first trench 16a.

At another portion of the second insulating interlayer 14 in the second region, a third trench 16c adjacent to the second trench 16b and in parallel to the second trench 16b may be formed. The third trench 16c may be disposed between the first and second trenches 16a and 16b. The third trench 16c may be connected from one end portion to the other end portion of the cell block. Accordingly, the third trench 16c may extend to a length greater than the adjacent second trench 16b. The third trench 16c may have a third line width d3 smaller than the second line width d2 of the second trench 16b. Particularly, the third line width d3 may be the same as the first line width d1.

A fourth trench 16d may be formed at another portion of the second insulating interlayer 14 in the second region. The fourth trench 16d may be connected to the third trench 16c and may be disposed in a row with the second trench 16b. A plurality of the four trenches 16d may be disposed in a row with one of the second trenches 16b and may have a line shape extending in the first direction. In addition, the fourth trenches 16d may penetrate a portion of a sidewall of the adjacent third trenches. The first, second, third and fourth trenches 16a and 16d, and any subcombination thereof, may be formed in a single photolithography operation.

Figure 5:
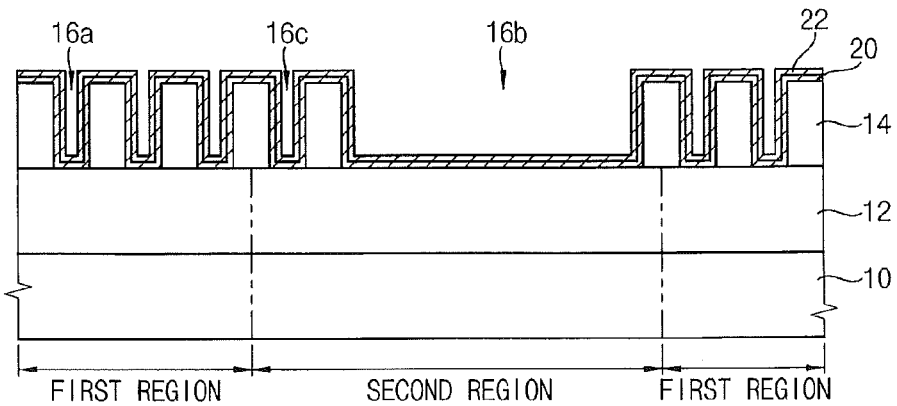

Referring to FIG. 5, a barrier metal layer 20 may be formed along the first to fourth trenches 16a~16d and the second insulating interlayer 14. The barrier metal layer 20 may be formed using titanium, titanium nitride, tantalum, tantalum nitride, etc. The barrier metal layer 20 may be formed as a single layer or as a multi-layer obtained by integrating two or more sublayers. The barrier metal layer 20 may be formed by a physical vapor deposition method and/or a chemical vapor deposition method.

A seed copper layer 22 may be formed on the barrier metal layer 20. The seed copper layer 22 may be formed by a physical vapor deposition method.

Figure 6:
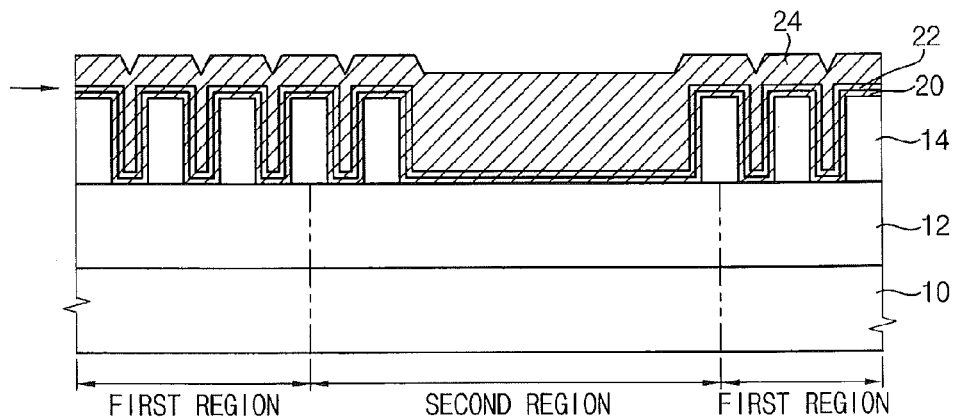

Referring to FIG. 6, a copper layer 24 may be formed on the seed copper layer 22 so as to fill up the first to fourth trenches 16a~16d with the copper layer 24. The copper layer 24 may be formed by an electroplating method. Particularly, the substrate 10 including the seed copper layer 22 may be loaded on an electroplating apparatus. The substrate 10 may be provided so as to face an anode electrode. A cathode electrode may make a connection with an edge portion of a backside of the substrate 10. An electroplating solution may inflow onto the substrate 10. A voltage may be applied between the anode and the cathode so as to apply an electroplating current through the seed copper layer 22. Then, a copper coating may be performed on the seed copper layer 22 to form the copper layer 24. The electroplating current may be applied along a direction designated by an arrow in FIG. 6.

Hereinafter, example embodiments may be explained referring to the shapes of the trenches illustrated in FIG. 4.

The seed copper layer 22 in the first trench 16a may extend in the first direction. Accordingly, a high electroplating current may flow at a center portion and an edge portion of the cell block by the seed copper layer 22 in the first trench 16a. A thickness decrease of the copper layer 24 may be reduced or prevented, and generation of voids in the copper layer 24 may be restrained in the first trench 16a.

Similar to the first trench 16a, the third trench 16c may extend along the first direction so as to be connected from an end portion to the other end portion of each cell block in the semiconductor device. Accordingly, the seed copper layer 22 within the third trench 16c may have a shape continuously connected in the first direction. When a voltage is applied to the cathode electrode at the edge portion of the backside of the substrate 10, a high electroplating current may flow at a center portion and an edge portion of the cell block of the device through the seed copper layer 22 within the third trench 16c. A strong electric field may be generated at nearby portion of the cell block. A decrease of the thickness of the copper layer 24 in the third trench 16c may be reduced or prevented, and generation of voids in the copper layer 24 may be restrained in the third trench 16c.

The fourth trench 16d may penetrate one side of the third trench 16c. The seed copper layer 22 formed in the fourth trench 16d may have a shape making an electric connection with the seed copper layer 22 formed in the third trench 16c. Since the high electroplating current may flow through the seed copper layer 22 formed in the third trench 16c, the high electroplating current may also flow through the seed copper layer 22 formed in, the fourth trench 16d. Thickness decrease of the copper layer 24 in the fourth trench 16d may be reduced or prevented, and generation of voids in the copper layer 24 in the fourth trench 16d may be restrained.

The second trench 16b may have a line shape extending in the first direction and may be disconnected from an end portion to the other end portion of each cell block in the semiconductor device. Since the second trench 16b may not extend to the end portion of the cell block, the high electroplating current may hardly flow through the seed copper layer 22 in the second trench 16b even though the voltage may be supplied through the edge portion of the backside of the substrate 10.

Figure 8A:
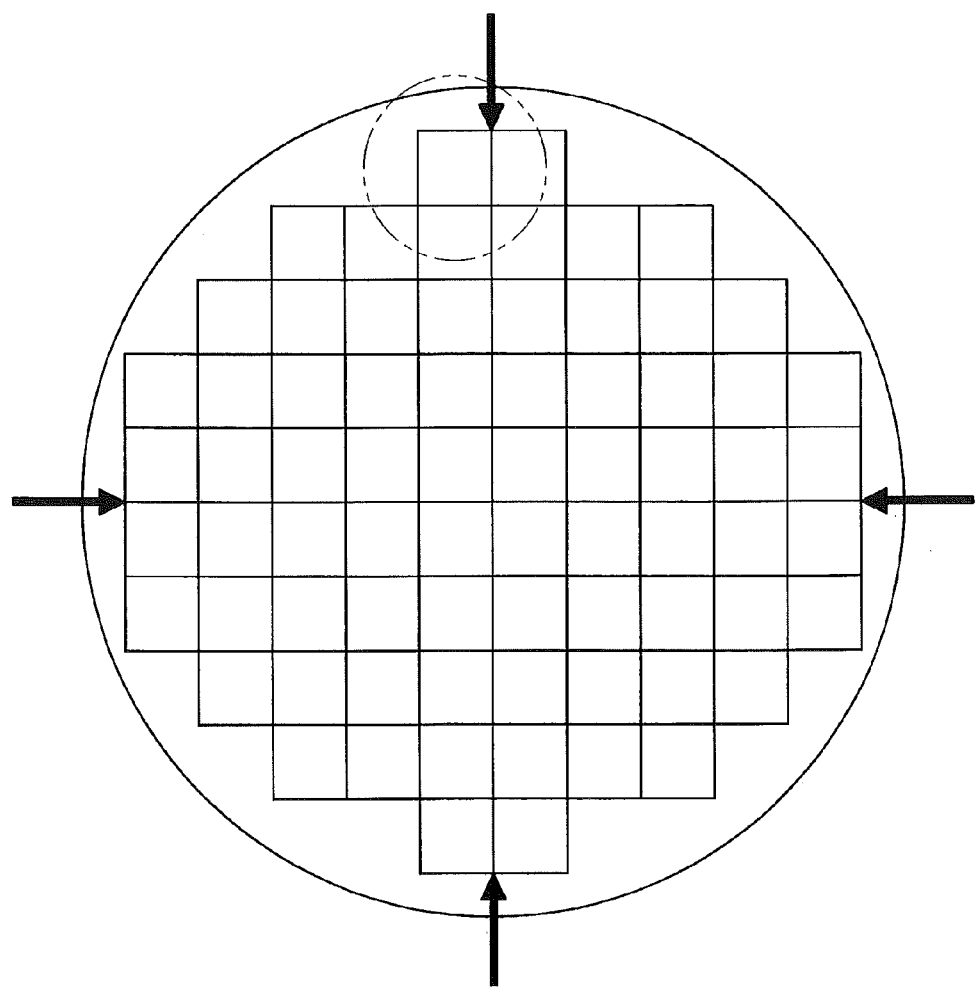
FIG. 8A is a plan view of a substrate to be electroplated with copper.
Figure 8B:
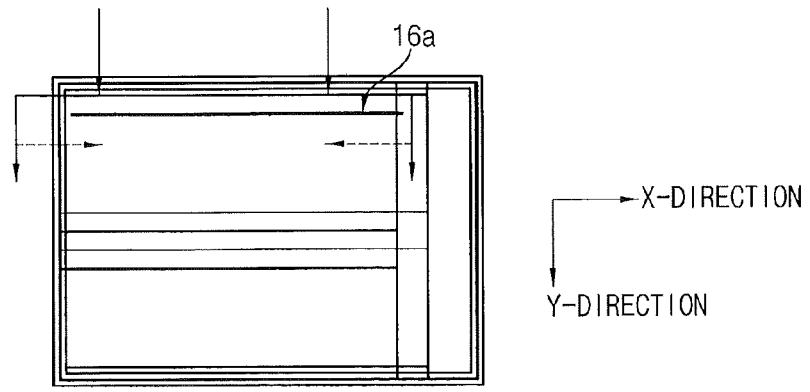
FIG. 8B is a plan view of a semiconductor chip included in the substrate illustrated in FIG. 8A.

FIG. 8A is a plan view of a substrate and chips included in the substrate to be electroplated with copper. FIG. 8B is a plan view of a semiconductor chip provided at upper and lower portions of the substrate illustrated in FIG. 8A.

Referring to FIGS. 8A and 8B, a voltage may be applied from an edge portion of the backside of the substrate 10 while performing an electroplating of the substrate 10 with copper. That is, the electroplating current may flow along each direction designated by arrows in FIG. 8A.

The first and third trenches 16a and 16c of the substrate 10 may extend in the first direction so as to be connected from an end portion to the other end portion of each cell block of the semiconductor device. Accordingly, the seed copper layer 22 within the first and third trenches 16a and 16c may have a continuously connected shape in the first direction.

For the upper and lower portions of the substrate 10, the applying direction of the voltage and the extending direction of each trench, that is, the first direction may be vertical to each other.

Referring to FIG. 8B, the voltage applying direction may be along a y-axis and the extending direction of the trenches and the forming direction of the copper wiring may be along an x-axis. Accordingly, less of the electroplating current for forming the copper wiring may flow at the upper and lower regions of the substrate 10 relative to other regions of the substrate 10. In addition, in a chip formed on the upper and lower regions of the substrate 10, a flowing path of the electroplating current may be lengthened and an application of the current into a center portion of the chip may become difficult. Accordingly, even greater numbers of defects may be generated at the center portion of the chip.

In various embodiments described herein, since the third trench 16c adjacent to the second trench 16b may have a shape extending to the end portion of the cell block, a strong electric field may be generated through the seed copper layer 22 formed in the third trench 16c. Accordingly, a sufficient amount of the electroplating current may flow through the seed copper layer 22 formed in the second trench 16b owing to the seed copper layer 22 formed in the third trench 16c. In this case, the thickness of the copper layer 24 positioned in the second trench 16b may not decrease and voids may be barely generated in the copper layer 24 in the second trench 16b. In addition, the copper layer 24 may be normally formed even on the upper and lower portions of the substrate 10.

As described above, since the third trench 16c extending to the end portion of the cell block may be provided adjacent to the second trench 16b, an inner portion of the second trench 16b may be sufficiently filled up with the copper layer 24. Since the third trench 16c may be connected with the fourth trench 16d, an inner portion of the fourth trench 16d may also be sufficiently filled up with the copper layer 24.

Figure 7:
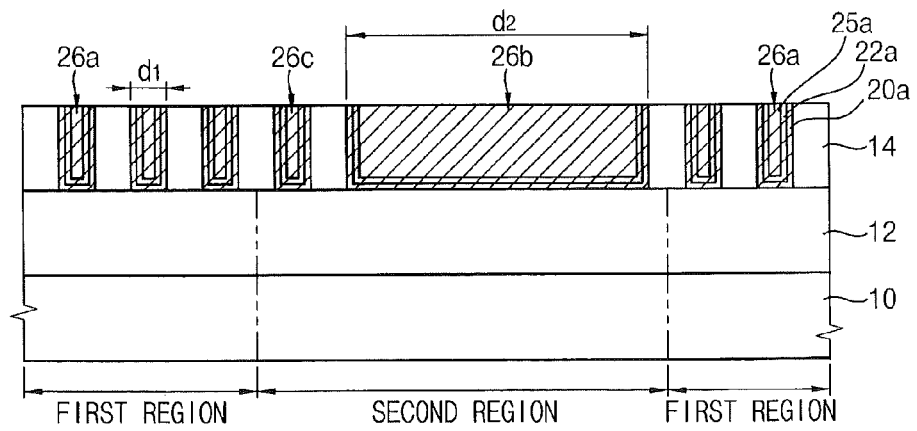

Referring to FIGS. 7 and 2, the copper layer 24, the seed copper layer 22 and the barrier metal layer 20 may be selectively removed, such as by polishing including a chemical mechanical polishing process, sufficiently to expose an upper surface portion of the second insulating interlayer 14. A first conductive pattern 26a may be formed in the first trench 16a, a second conductive pattern 26b may be formed in the second trench 16b, a first dummy conductive pattern 26c may be formed in the third trench 16c and a second dummy conductive pattern 26d may be formed in the fourth trench 16d, respectively. Further, a barrier metal layer pattern 20a and a seed copper layer pattern 22a may be formed in the first, second, third and fourth trenches 16a, 16b, 16c and 16d.

The first and second dummy conductive patterns 26c and 26d may be formed not for being used as effective connecting wirings in a semiconductor device but may be formed for accomplishing a normal patterning of the effective connecting wirings, that is, the first and second conductive patterns 26a and 26b. As described above, since the first dummy conductive pattern 26c may be formed adjacent to the second conductive pattern 26b having a relatively great line width, a pattern defect generated due to an insufficient electroplating current may be decreased. Particularly, generation of pattern defect due to an insufficient amount of the electroplating current at a center portion of a chip in one semiconductor chip may be decreased.

Second Embodiments

Figure 9:
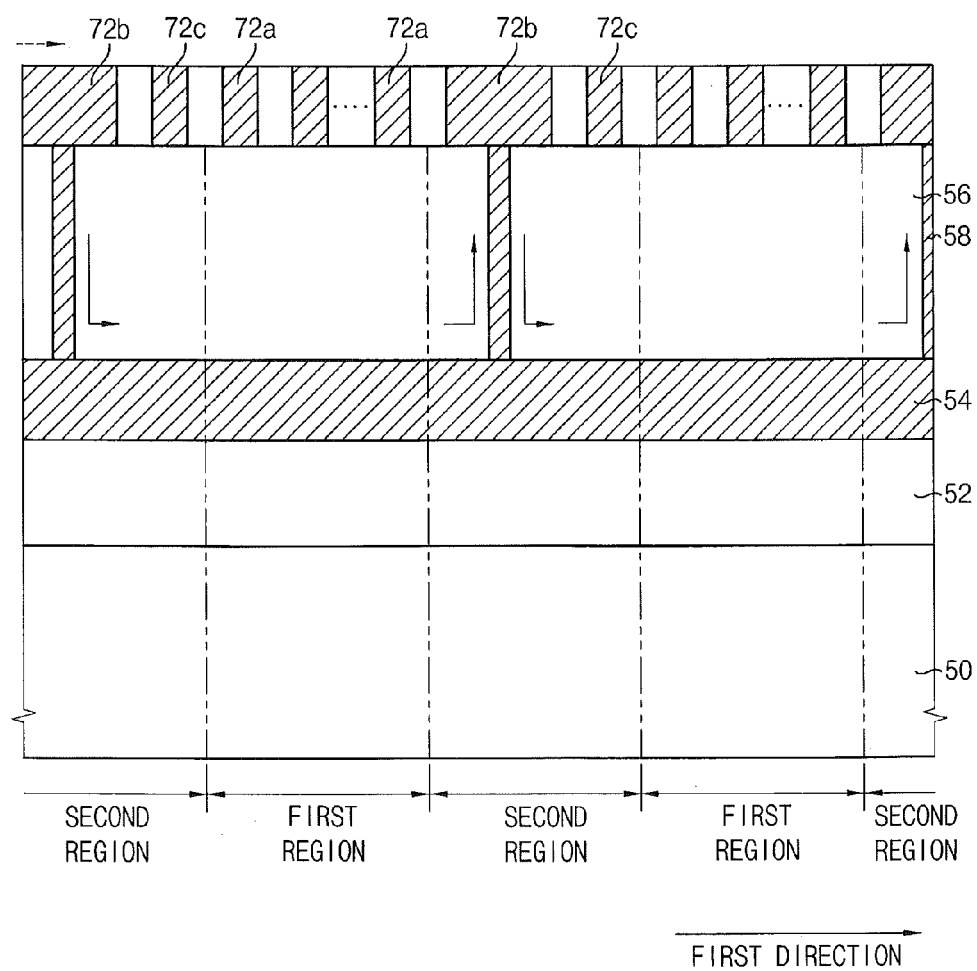
Figure 10:
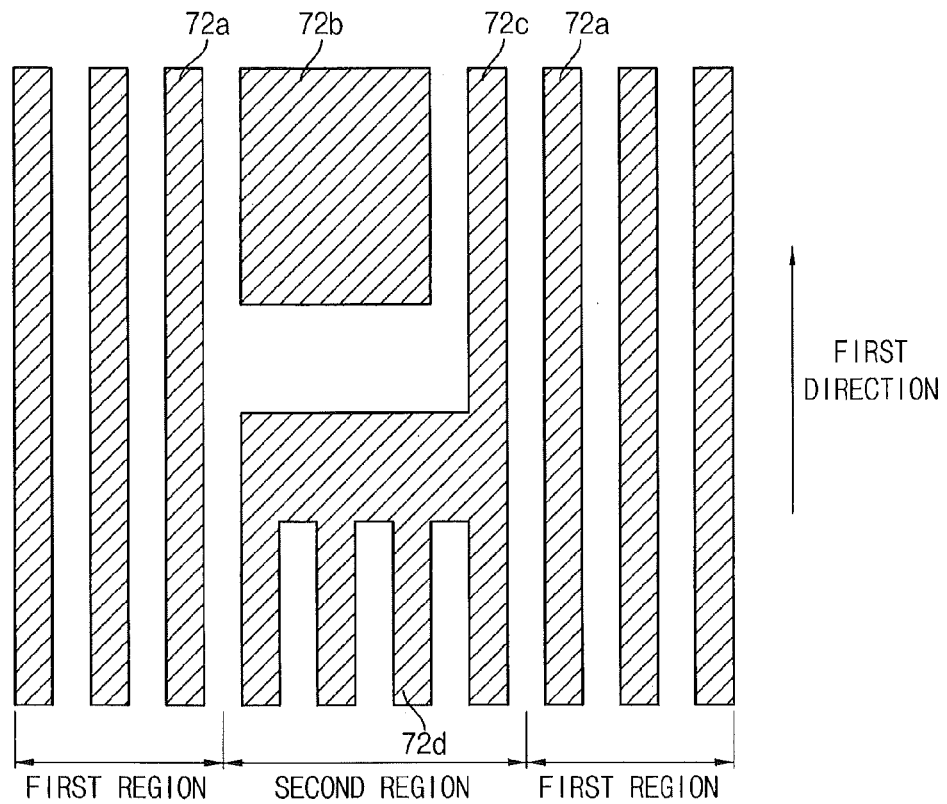

FIG. 9 is a cross-sectional view of a conductive pattern structure in accordance with second embodiments described herein. FIG. 10 is a plan view of the conductive pattern structure illustrated in FIG. 9.

Referring to FIGS. 9 and 10, a substrate 50 including a first region and a second region may be provided. The substrate 50 includes a single element and/or compound semiconductor material in bulk wafer and/or layer form. On the substrate 50, switching devices such as a transistor may be formed. A first insulating layer, such as a first insulating interlayer 52, covering the switching devices formed on the substrate 50 may be formed. The first insulating interlayer 52 may be formed using silicon oxide. Through the first insulating interlayer 52, a contact plug making an electric connection with the substrate 50 may be formed.

A first metal wiring 54 may be farmed on the first insulating interlayer 52. The first metal wiring 54 may have a line shape extending in a second direction. Conductive lines forming the first metal wiring 54 may be provided repeatedly. The first metal wiring 54 may be formed using copper or tungsten.

A second insulating interlayer 56 covering the first metal wiring 54 may be formed. Through the second insulating interlayer 56, metal contacts making a contact with the conductive lines forming the first metal wiring 54 may be formed.

A first conductive pattern 72a may be formed on the second insulating interlayer 56 in the first region and a second conductive pattern 72b, a first dummy conductive pattern 72c and a second dummy conductive pattern 72d may be formed on the second insulating interlayer 56 in the second region. The first and second conductive patterns 72a and 72b and the first and second dummy conductive patterns 72c and 72d may include copper. Particularly, the first and second conductive patterns 72a and 72b and the first and second dummy conductive patterns 72c and 72d may be formed by integrating a barrier metal layer and a copper layer. The first and second conductive patterns 72a and 72b and the first and second dummy conductive patterns 72c and 72d may have a similar shape as the copper wirings explained in first embodiments and illustrated in FIG. 2.

The first conductive pattern 72a may be an effective conductive line and may have a first line width in a semiconductor device as illustrated in FIG. 10. The first conductive patterns may provide signal lines (including address, data and/or control signals) for the semiconductor device during operation thereof after manufacture. The first conductive pattern 72a may have a line shape extending in a first direction perpendicular to the second direction and patterns having the same width may be provided repeatedly while keeping the same gap. Particularly, the first conductive pattern 72a may extend lengthwise in the first direction so as to be connected from an end portion to the opposing end portion of each cell block in the semiconductor device, shown as the top and bottom ends of FIG. 10.

The second conductive pattern 72b may be an effective conductive line in the semiconductor device, may have a second line width greater than the first line width and may have a line shape extending in the first direction. The second conductive pattern 72b may be shorter than the first conductive pattern 72a. That is, the second conductive pattern 72b may be disconnected from an end portion to the other end portion of each cell block different from the first conductive pattern 72a. Particularly, the second line width may be greater than the first line width by three times or more. The second conductive pattern 72b may make a contact with the metal contact 58 and may make an electric connection with the underlying first metal wiring 54. The second conductive pattern 72b may provide a reference voltage (e.g., ground or power).

The first dummy conductive pattern 72c may not be used as an effective conductive line in a semiconductor device. Stated differently, the dummy conductive patterns do not carry a signal or reference voltage during operation of the semiconductor device after manufacture. The first dummy conductive pattern 72c may be spaced apart from at least one sidewall of the second conductive pattern 72b and may have a line shape extending in the same direction as the extending direction of the second conductive pattern 72b. Particularly, the first dummy conductive pattern 72c may be spaced apart from one sidewall of the second conductive pattern 72b. In this case, one of the first dummy conductive patterns 72c may be provided per one of the second conductive patterns 72b. Alternatively, the first dummy conductive pattern 72c may be spaced apart from both sidewalls of the second conductive pattern 72b. In this case, two of the first dummy conductive patterns 72c may be provided per one of the second conductive patterns 72b.

The first dummy conductive pattern 72c may extend longer than the second conductive pattern 72b. Particularly, the first dummy conductive pattern 72c may extend lengthwise in the first direction so as to be connected from an end portion to the other end portion of each cell block of the semiconductor device. In addition, the first dummy conductive pattern 72c may have a line width smaller than the second line width.

The second dummy conductive pattern 72d may be provided in a same row as the second conductive pattern 72b and may have a line shape in parallel with the first dummy conductive pattern 72c. The second dummy conductive pattern 72d may be connected with the first dummy conductive pattern 72c at an end portion adjacent to the second conductive pattern 72b.

The first dummy conductive pattern 72c may be used as a conductive line for supplying a sufficient amount of current for forming the second conductive pattern 72b having a desired height while reducing or eliminating generation of voids. Since the second conductive pattern 72b may have a shape disconnected from an edge portion of a cell block, a sufficient amount of voltage may not be supplied from the edge portion of the substrate 50, as explained in the first embodiment. Accordingly, less current than required for forming a copper layer may be supplied. Particularly, when the first direction is a y-axis, the supplying amount of the current at the upper and lower portions of the substrate 50 may be insufficient.

In example embodiments, the supplied voltage from the edge portion of the substrate 50 may flow through the first metal wiring 54 extending in the x-axis to a nearby portion including the second conductive pattern 72b formed at the center portion of the substrate 50. Accordingly, the supplying amount of the current to the edge portion of the cell may be smaller than the supplying amount of the current to the center portion of the cell when considering a cell block of a semiconductor device.

In example embodiments, the first dummy conductive pattern 72c and the first conductive pattern 72a may be spaced apart from both sidewalls of the second conductive pattern 72b. The first dummy conductive pattern 72c and the first conductive pattern 72a may have the shapes extending lengthwise in the first direction so as to be connected from an end portion to the opposing end portion of each cell block. Accordingly, the supplied voltage from the edge portion of the substrate 50 may be applied through the first conductive pattern 72a and the first dummy conductive pattern 72c.

Accordingly, a sufficiently high electric field may be applied to a nearby portion of the second conductive pattern 72b by the first dummy conductive pattern 72c. The second conductive pattern 72b having a sufficiently great thickness may be formed as a normal pattern at the edge portion of the cell block without forming any or excessive voids.

In addition, since the first dummy conductive pattern 72c and the second dummy conductive pattern 72d are electrically connected, a sufficient current may be applied to the second dummy conductive pattern 72d. Accordingly, the second dummy conductive pattern 72d having a sufficiently great thickness may be formed as a normal pattern without forming any or excessive voids.

FIGS. 11 to 16 are a plan view and cross-sectional views for explaining methods of manufacturing the conductive pattern structure illustrated in FIGS. 9 and 10.

Figure 11:
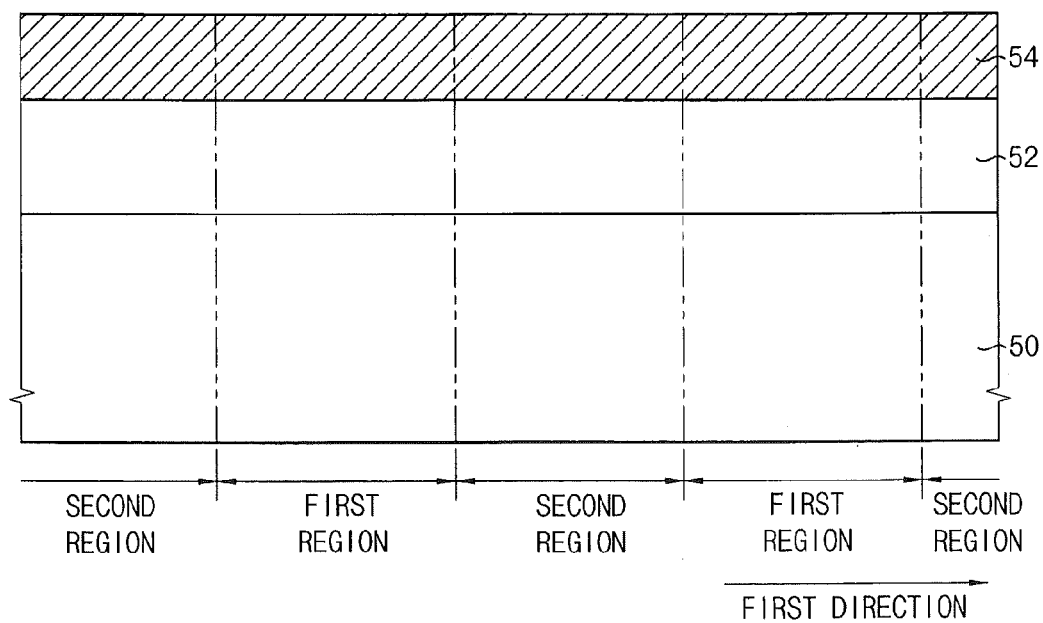

Referring to FIG. 11, a substrate 50 including a first region and a second region may be provided. Switching devices such as transistors may be formed on the substrate 50.

A first insulating interlayer 52 covering the switching devices may be formed. The first insulating interlayer 52 may be formed using an insulating material such as silicon oxide. The first insulating interlayer 52 may be formed so as to form a planar upper surface portion.

Through the first insulating interlayer 52, a contact plug making an electric contact with the substrate 50 may be formed. The contact plug may be formed using polysilicon and/or a metal material.

On the first insulating interlayer 52, a first metal wiring 54 making an electric contact with the contact plug may be formed. The metal wiring 54 may have a line shape extending in a second direction. The first metal wiring 54 may be formed using a metal material such as tungsten, copper, etc. The first metal wiring 54 may be formed by a depositing process and/or a patterning process in accordance with the metal material. Alternatively, the first metal wiring 54 may be formed by a damascene process.

Figure 12:
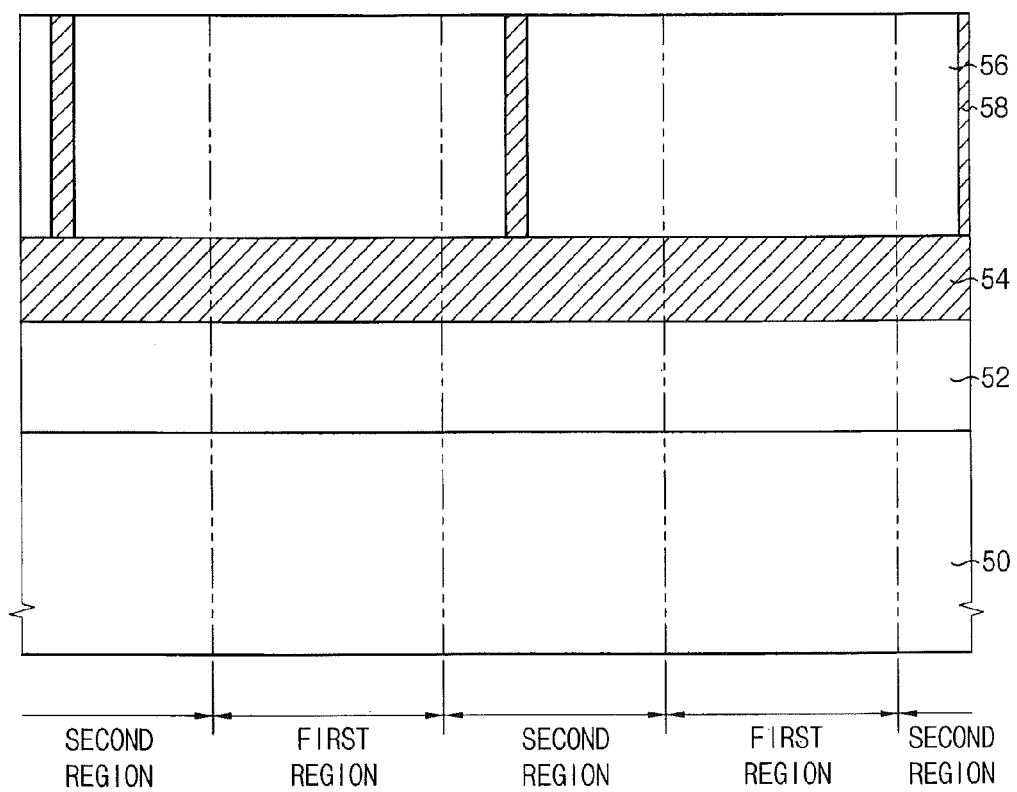

Referring to FIG. 12, a second insulating interlayer 56 covering the first metal wiring 54 may be formed. The second insulating interlayer 56 may be partially etched to form a contact hole. The contact hole may be filled up with a metal material to form a metal contact 58.

Figure 13:
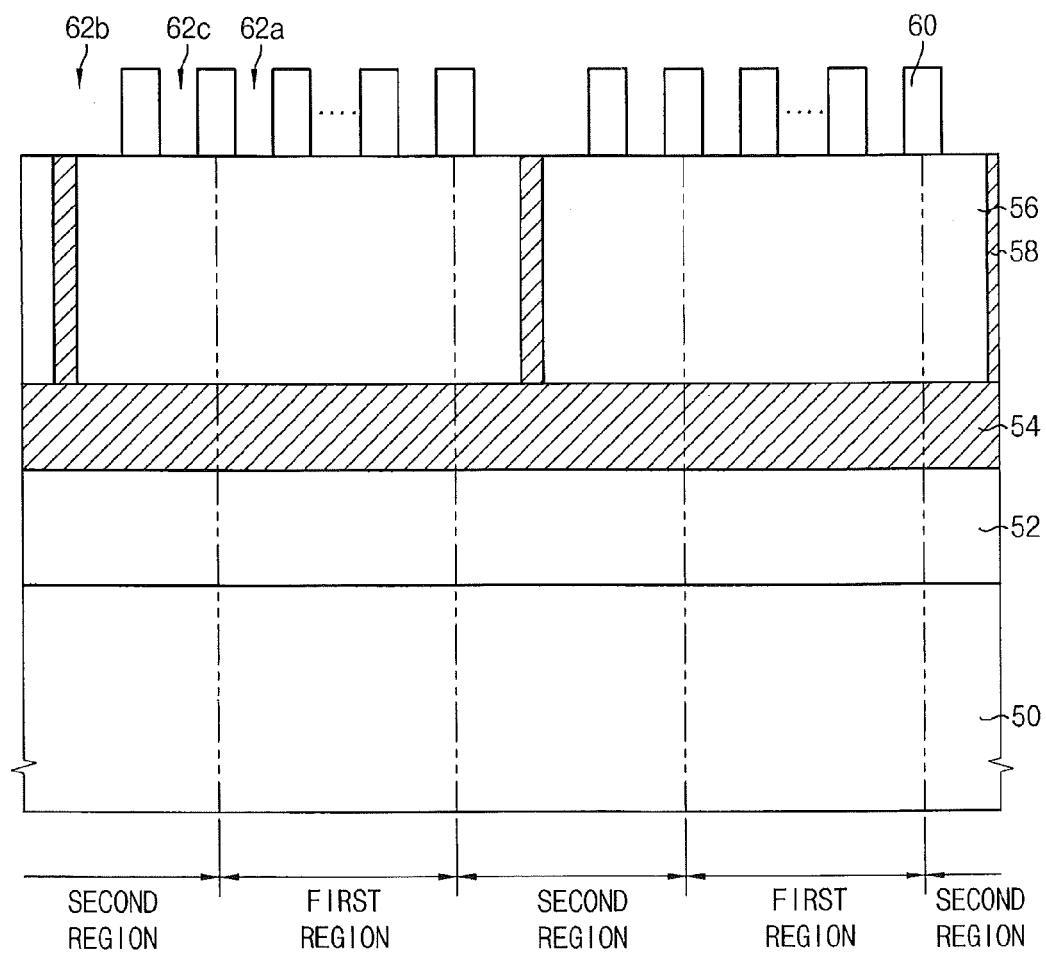
Figure 14:
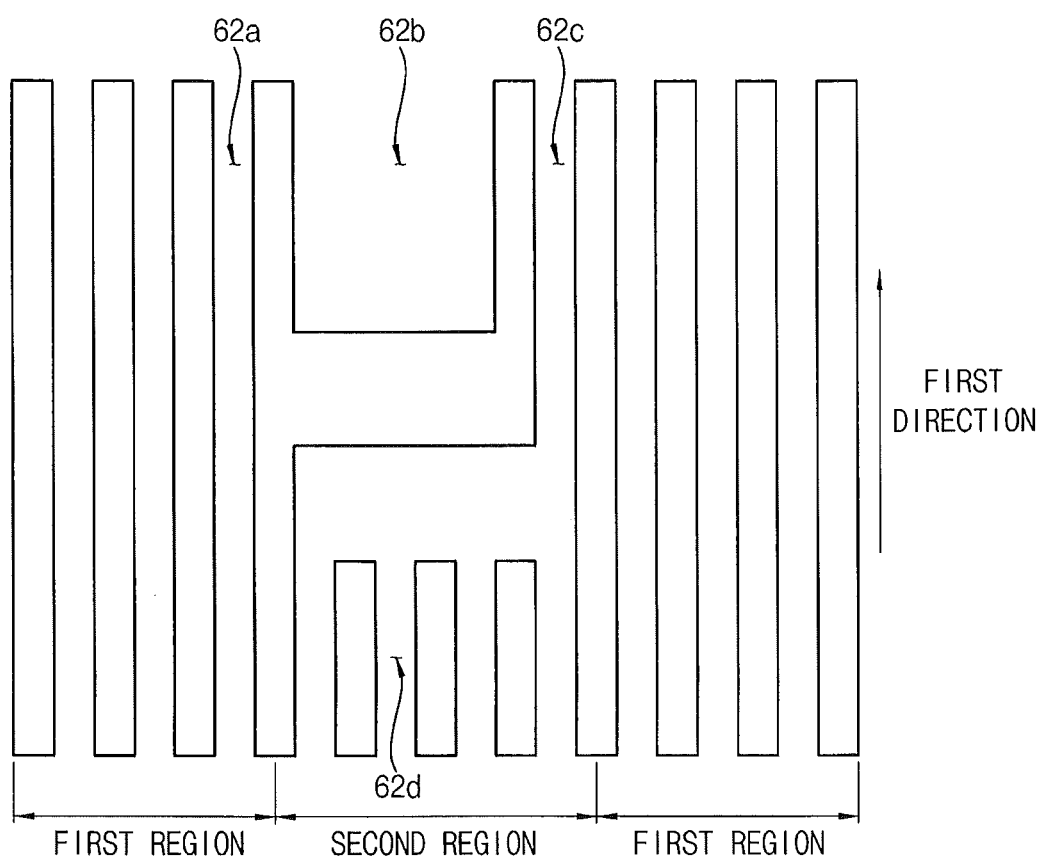

Referring to FIGS. 13 and 14, a third insulating interlayer 60 may be formed on the second insulating interlayer 56. The third insulating interlayer 60 may be etched by means of photolithography to remove portions for forming conductive patterns to form first, second, third and fourth trenches 62a, 62b, 62c and 62d. The first to fourth trenches 62a~62d may have the shapes extending in a first direction perpendicular to the second direction.

The first to fourth trenches 62a'~62d may have almost the same shapes as the first to fourth trenches 16a~16d illustrated in FIG. 4. The second trench 62b may be positioned so as to expose an upper surface portion of the metal contact 58.

Figure 15:
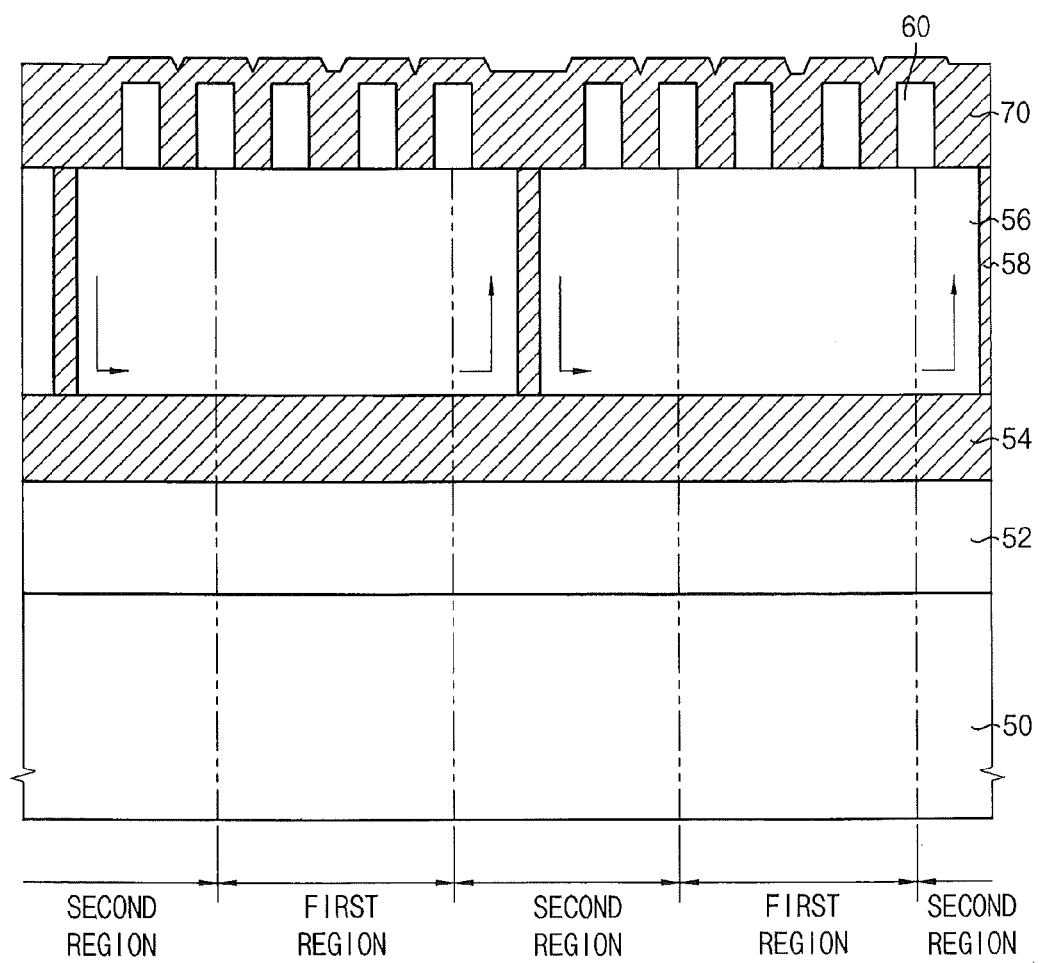

Referring to FIG. 15, a barrier metal layer may be formed along the first to fourth trenches 62a~62d and the third insulating interlayer 60. The barrier metal layer may be formed using titanium, titanium nitride, tantalum, tantalum nitride, etc. These compounds may be used alone or in combination. The barrier metal layer may be formed as a single layer or as an integrated layer of two or more sublayers. The barrier metal layer may be formed by means of a physical vapor deposition method and/or a chemical vapor deposition method.

On the barrier metal layer, a seed copper layer may be formed. The seed copper layer may be formed by a physical vapor deposition method.

On the seed copper layer, a copper layer filling up the first to fourth trenches 62a~62d may be formed. The copper layer may be formed by an electroplating method.

The first to third trenches 62a'~62c of the substrate 50 may extend in the first direction so as to be connected from an end portion to the opposite end portion of each cell block in a semiconductor device. Accordingly, a high electroplating current may flow at the edge portion as well as at the center portion of the substrate 50. Decrease of the electroplating current and a resulting decrease of the thickness of a copper layer 70 positioned in the first trench 62a may be reduced or prevented. In addition voids may be barely generated within the copper layer 70.

The second trench 62b may have a line shape extending in the first direction and may be disconnected from an end portion to the other end portion of each cell block of the semiconductor device. Accordingly, a high electroplating current may not flow through the seed copper layer in the second trench 62b even though a voltage may be supplied to a cathode at an edge portion of a backside of the substrate 50.

When the extending direction of the second trench 62b, that is, the first direction is a y-axis direction, the voltage applying direction and the extending direction of the second trench 62b may be perpendicular to each other at the upper and lower regions of the substrate 50. Accordingly, the flowing amount of the current may be small and defects may be easily generated at the upper and lower portions of the substrate 50. Further, in a chip formed at the upper and lower portions of the substrate 50, a sufficient amount of the electroplating current may be applied to the center portion of the chip through the metal wiring to the second trench 62b and the electroplating current may flow to the center portion of the chip. However, the electroplating current may be low at the edge portion of the chip and defects may be easily generated at the edge portion of the chip.

In example embodiments, the first and third trenches 62a and 62c extending to the end portion of the cell block may be formed at both sides of the second trench 62b. A strong electric field may be generated through the seed copper layer formed in the third trench 62c. Accordingly, a sufficient amount of the electroplating current may flow through the seed copper layer formed in the second trench 62b by the seed copper layer formed in the third trench 62c. The thickness decrease of the copper layer 70 positioned in the second trench 62b may be reduced or prevented and generation of voids in the copper layer 70 may be restrained.

The fourth trench 62d may be connected to one side of the third trench 62c as illustrated in FIG. 14. Accordingly, the seed copper layer formed in the fourth trench 62d may make an electric connection with the seed copper layer formed in the third trench 62c. The high electroplating current may also flow through the seed copper layer formed in the fourth trench 62d. The thickness decrease of the copper layer 70 positioned in the fourth trench 62d may be reduced or prevented and the generation of voids in the copper layer 70 may be restrained.

Figure 16:
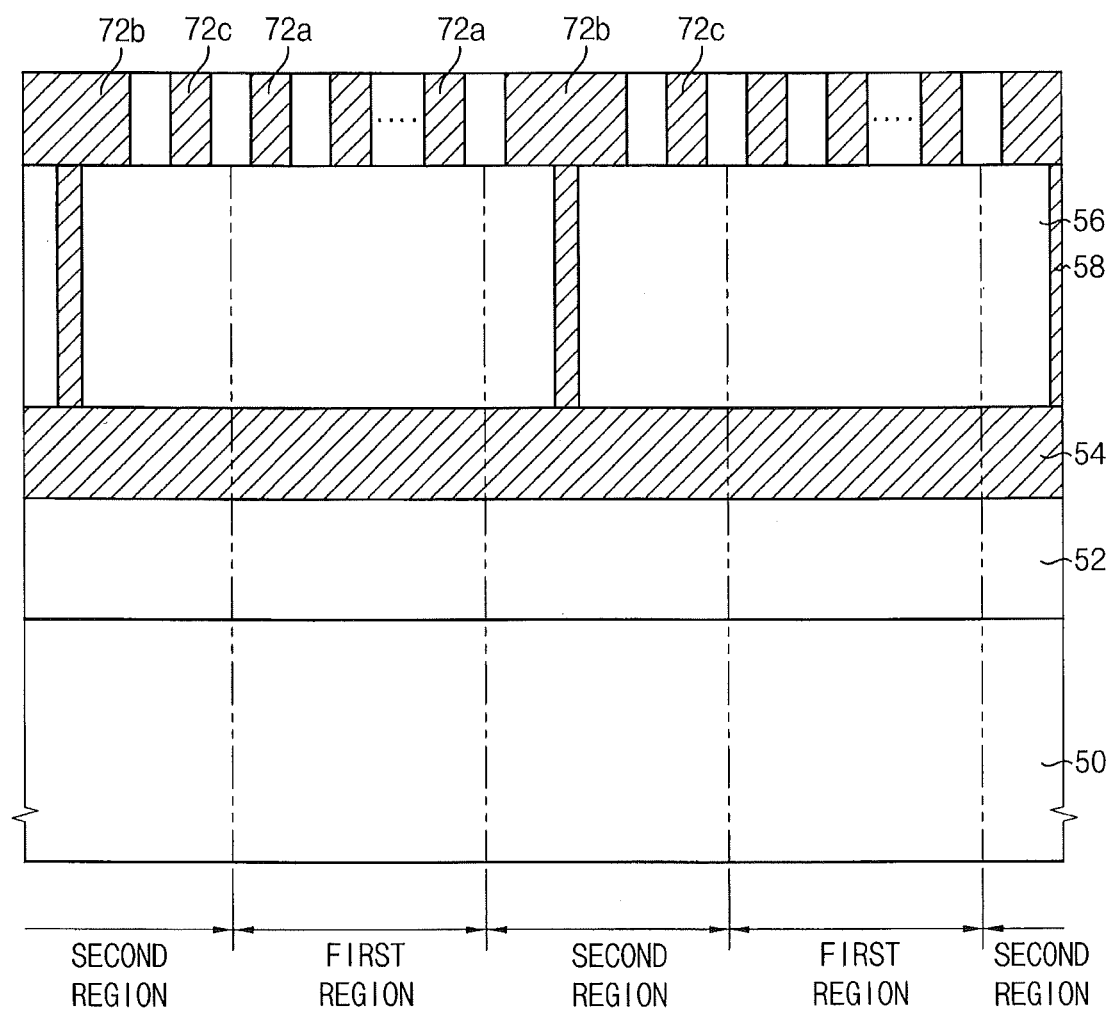

Referring to FIGS. 10 and 16, the copper layer 70 may be selectively removed such as by polishing, including a chemical mechanical polishing process, sufficiently to expose an upper surface portion of the second insulating interlayer 56. A first conductive pattern 72a may be formed in the first trench 62a, a second conductive pattern 72b may be formed in the second trench 62b, a first dummy conductive pattern 72c may be formed in the third trench 62c and a second dummy conductive pattern 72d may be formed in the fourth trench 62d, respectively.

Third Embodiments

Figure 17:
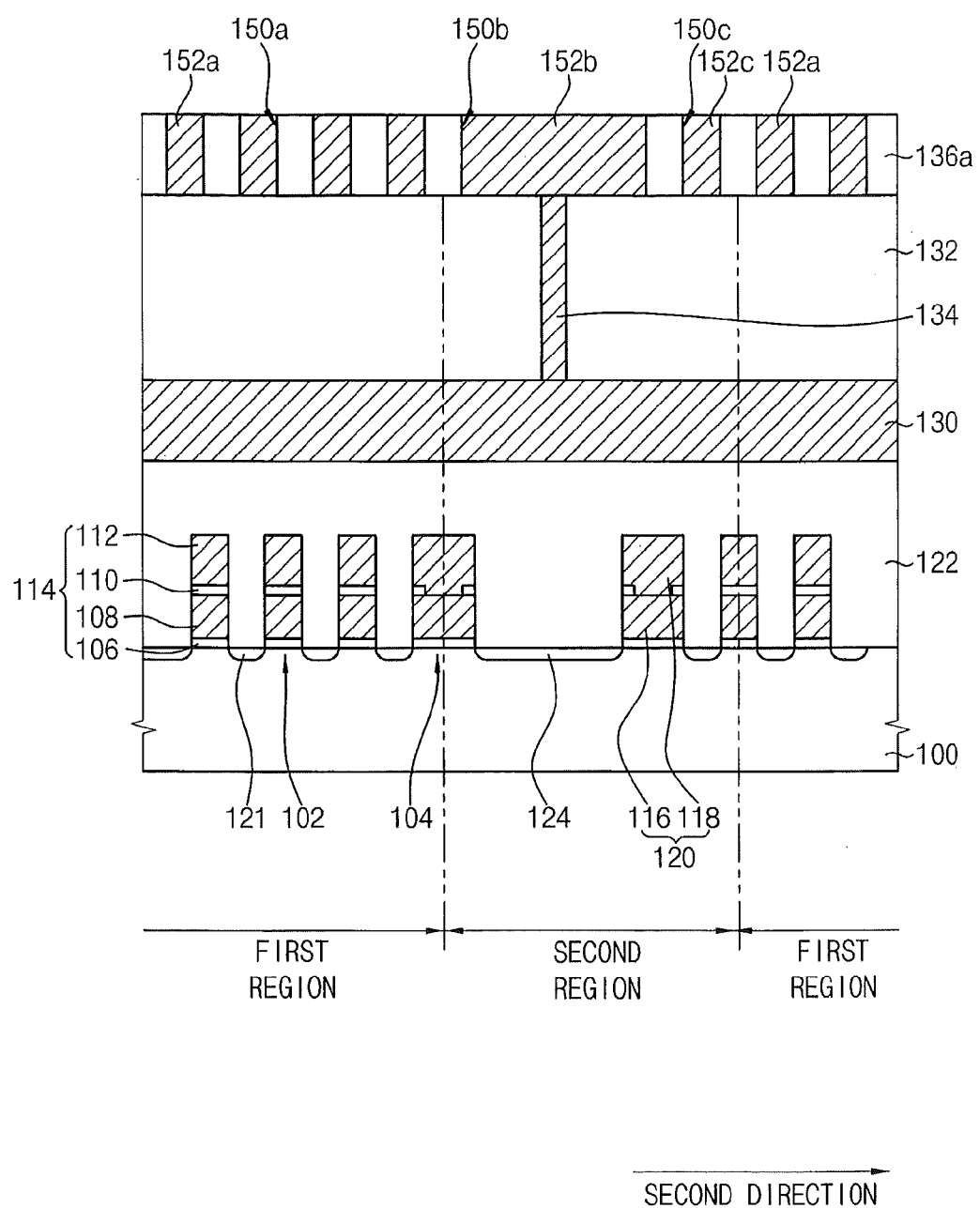
Figure 18:
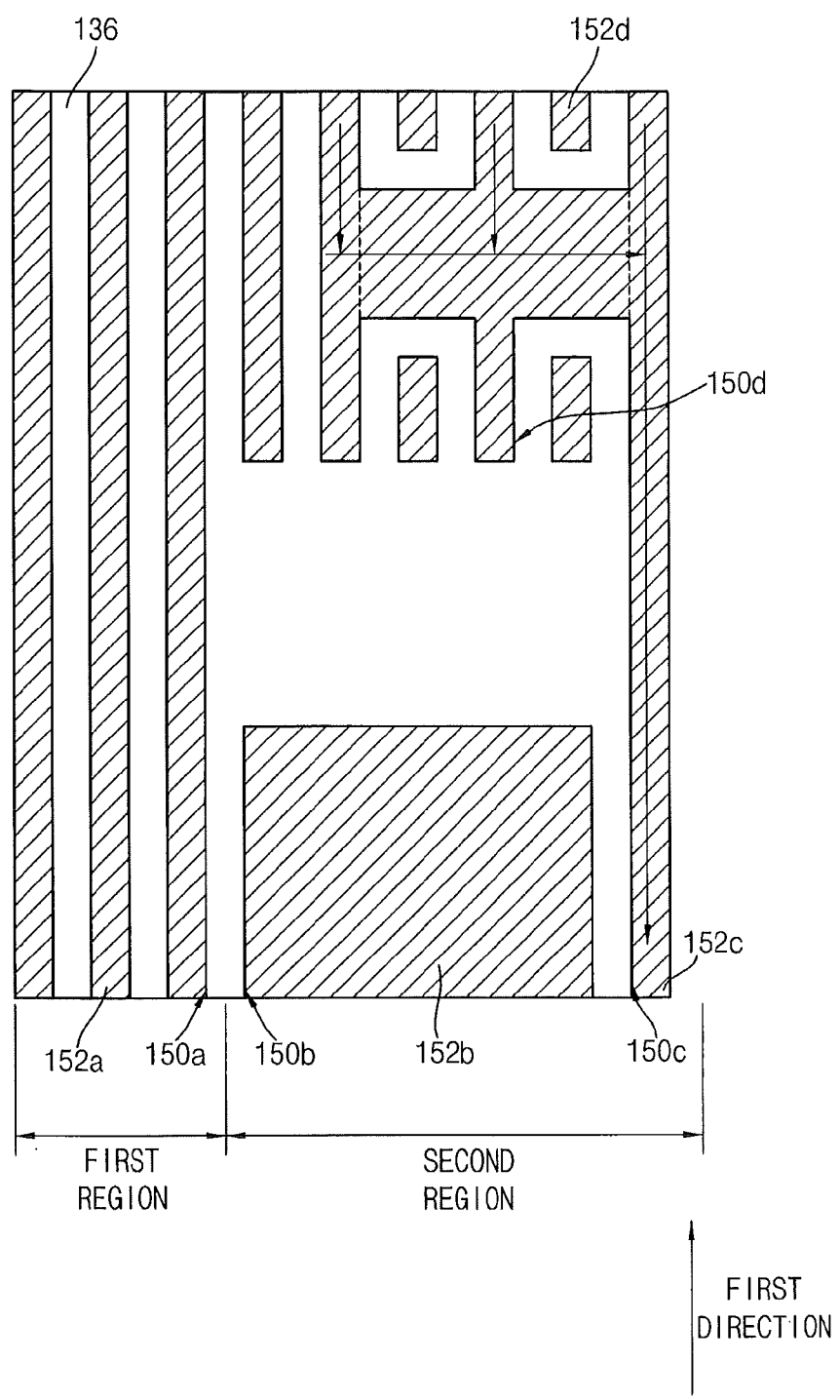

FIG. 17 illustrates a NAND flash memory device in accordance with third embodiments described herein. FIG. 18 illustrates a circuit diagram of the NAND flash memory device illustrated in FIG. 17.

Referring to FIG. 17, transistors constituting each cell may be formed in a string unit in a NAND flash memory device. For example, each cell string may include sixteen or thirty two cell transistors 102 connected in series. At both sides of the cell transistors 102, a cell selecting and ground selecting transistor 104 may be connected in series. An impurity doped region of the cell selecting and ground selecting transistor 104 may be a common source region 124. To the common source region 124, a common source line may be connected.

Hereinafter, the NAND flash memory device formed on a substrate may be explained in detail.

An active region having a line shape may be provided on a substrate 100. The substrate 100 includes a single element and/or compound semiconductor material in bulk wafer and/or layer form. On the substrate 100, a cell transistor 102, a cell selecting and ground selecting transistor 104 may be provided.

The cell transistor may include a first gate structure 114 including a tunnel oxide layer pattern 106, a charge storing layer pattern 108, a dielectric layer pattern 110 and a control gate pattern 112 integrated sequentially.

The cell selecting and ground selecting transistor 104 may include a second gate structure including a gate oxide layer pattern 116 and a gate electrode 118 integrated sequentially.

At both sides of the first and second gate structures 114 and 120, impurity doped regions may be provided. The impurity doped region at an end portion of the cell selecting and ground selecting transistor 104 may be the common source region 124.

A first insulating interlayer 122 covering the cell transistor 102 and the selecting transistor 104 may be formed. Through the first insulating interlayer 122, a contact plug connected to the common source region 124 of the substrate 100 may be provided. On the first insulating interlayer 122, a first metal wiring 130 having a line shape extending in a second direction may be formed.

A second insulating interlayer 132 covering the first metal wiring 130 may be formed. In the second insulating interlayer 132, a metal contact 134 making a contact with the first metal wiring 130 may be formed.

On the second insulating interlayer 132, a third insulating layer such as a third insulating interlayer pattern 136a may be provided. In the third insulating interlayer pattern 136a, a wiring including copper may be formed.

Referring to FIGS. 17 and 18, first, second, third and fourth trenches 150a, 150b, 150c and 150d may be provided in the third insulating interlayer pattern 136a. In the first to fourth trenches 150a~150d, first and second conductive patterns 152a and 152b and first and second dummy conductive patterns 152c and 152d may be formed, respectively. The first conductive pattern 152a may be provided as a signal line such as a bit line, the second conductive pattern 152b may be provided as a reference voltage line such as a power supply line. The second conductive pattern 152b may make an electric connection with the underlying first metal wiring 130.

The first and second conductive patterns 152a and 152b may have almost the same shape as explained in the first embodiments. That is, the second conductive pattern 152b may have a wider line width than the first conductive pattern 152a. At both sides of the second conductive pattern 152b, the first conductive pattern 152a and the first dummy conductive pattern 152c may be formed. The first conductive pattern 152a and the first dummy conductive pattern 152c may have line shapes extending to the same direction as the extending direction of the second conductive pattern 152b. The first conductive pattern 152a and the first dummy conductive pattern 152c may extend in the first direction so as to be connected from an end portion to the other end portion of each cell block of a semiconductor device shown at the top and bottom ends of FIG. 18.

The second dummy conductive pattern 152d may be provided in a row with the second conductive pattern 152b and may have a line shape in parallel with the first dummy conductive pattern 152a. A portion of the second dummy conductive patterns 152d may be connected to the first dummy conductive pattern 152c. The remaining portion of the second dummy conductive pattern 152d may be disconnected to the first dummy conductive pattern 152c.

FIGS. 19 to 26 are cross sectional views for explaining methods of manufacturing the NAND flash memory device illustrated in FIGS. 17 and 18. FIGS. 27 to 32 are plan views for explaining methods of manufacturing a metal wiring included in a NAND flash memory device.

Figure 19:
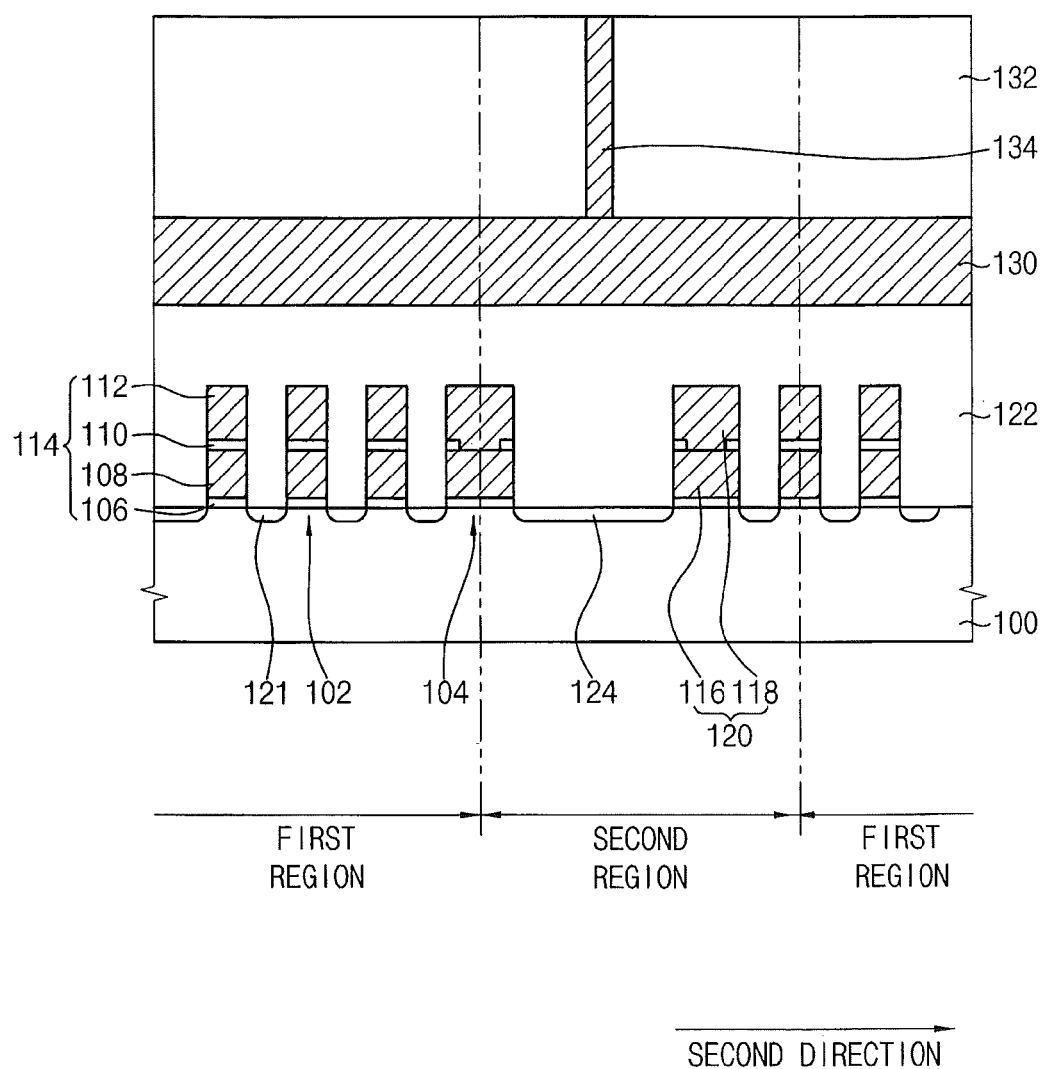

Referring to FIG. 19, a substrate 100 formed by using a semiconductor material may be provided. A device isolation process may be performed to form a device isolation layer pattern in the substrate 100. A cell transistor 102 and a selecting transistor 104 may be formed on the substrate 100. Hereinafter, forming methods of the cell transistor 102 and the selecting transistor 104 will be described in brief.

A surface portion of the substrate 100 may be oxidized to form a tunnel oxide layer and a gate oxide layer, respectively. On the tunnel oxide layer and the gate oxide layer, a preliminary charge storing layer pattern may be formed. The preliminary charge storing layer may be formed using polysilicon. Alternatively, the preliminary charge storing layer may be formed using silicon nitride capable of trapping charge. On the preliminary charge storing layer, a dielectric layer may be formed. The dielectric layer may be partially removed for forming the selecting transistor 104. A conductive layer may be formed on the dielectric layer. The conductive layer, the dielectric layer, the preliminary charge storing layer pattern and the tunnel oxide layer may be patterned sequentially.

A first gate structure 114 including a tunnel oxide layer pattern 106, a charge storing layer pattern 108, a dielectric layer pattern 110 and a control gate pattern 112 may be formed. Through performing the forming processes of the conductive layer and the patterning process, a second gate structure 120 including a gate oxide layer pattern 116 and a gate electrode 118 integrated sequentially may be formed in a portion where the selecting transistor 104 may be formed. Impurities may be doped into the substrate at both sides of the first and second gate structures 114 and 120 to form impurity regions at both sides of the first and second gate structures 114 and 120. In this case, the impurity region formed at an end portion of the selecting transistor 104 may become a common source region 124.

A first insulating interlayer 122 covering the cell transistor 102 and the selecting transistor 104 may be formed on the substrate 100. The first insulating interlayer 122 may be partially etched to form a contact hole. The contact hole may be filled up with a conductive material to form a contact plug.

On the first insulating interlayer 122, a first metal wiring 130 having a line shape and extending in the second direction may be formed. The first metal wiring 130 may be formed by performing a metal layer depositing process and a following patterning process. Alternatively, the first metal wiring 130 may be formed through a damascene process. The first metal wiring 130 may include an integrated structure of a barrier metal layer pattern and a tungsten pattern. Alternatively, the first metal wiring 130 may include an integrated structure of a barrier metal layer pattern and a copper pattern.

A second insulating interlayer 132 covering the first metal wiring 130 may be formed. The second insulating interlayer 132 may be partially etched to form a contact hole exposing an upper surface portion of the first metal wiring 130. The inner portion of the contact hole may be filled up with a metal material to form a metal contact 134.

Figure 20:
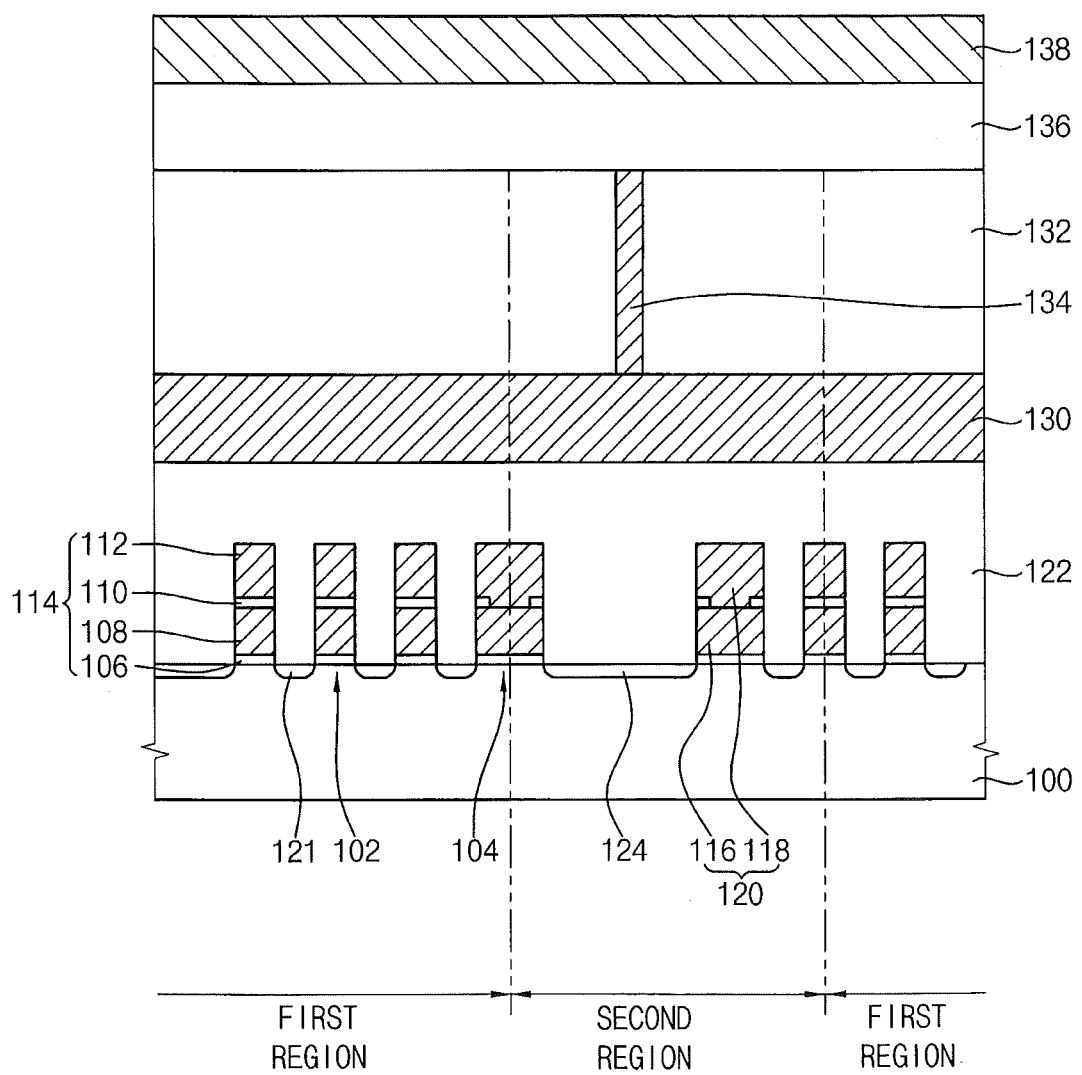

Referring to FIG. 20, a third insulating layer such as a third insulating interlayer 136 may be formed on the second insulating interlayer 132. A hard mask layer 138 may be formed on the third insulating interlayer 136. Particularly, the hard mask layer 138 may be formed as a polysilicon layer.

Figure 21:
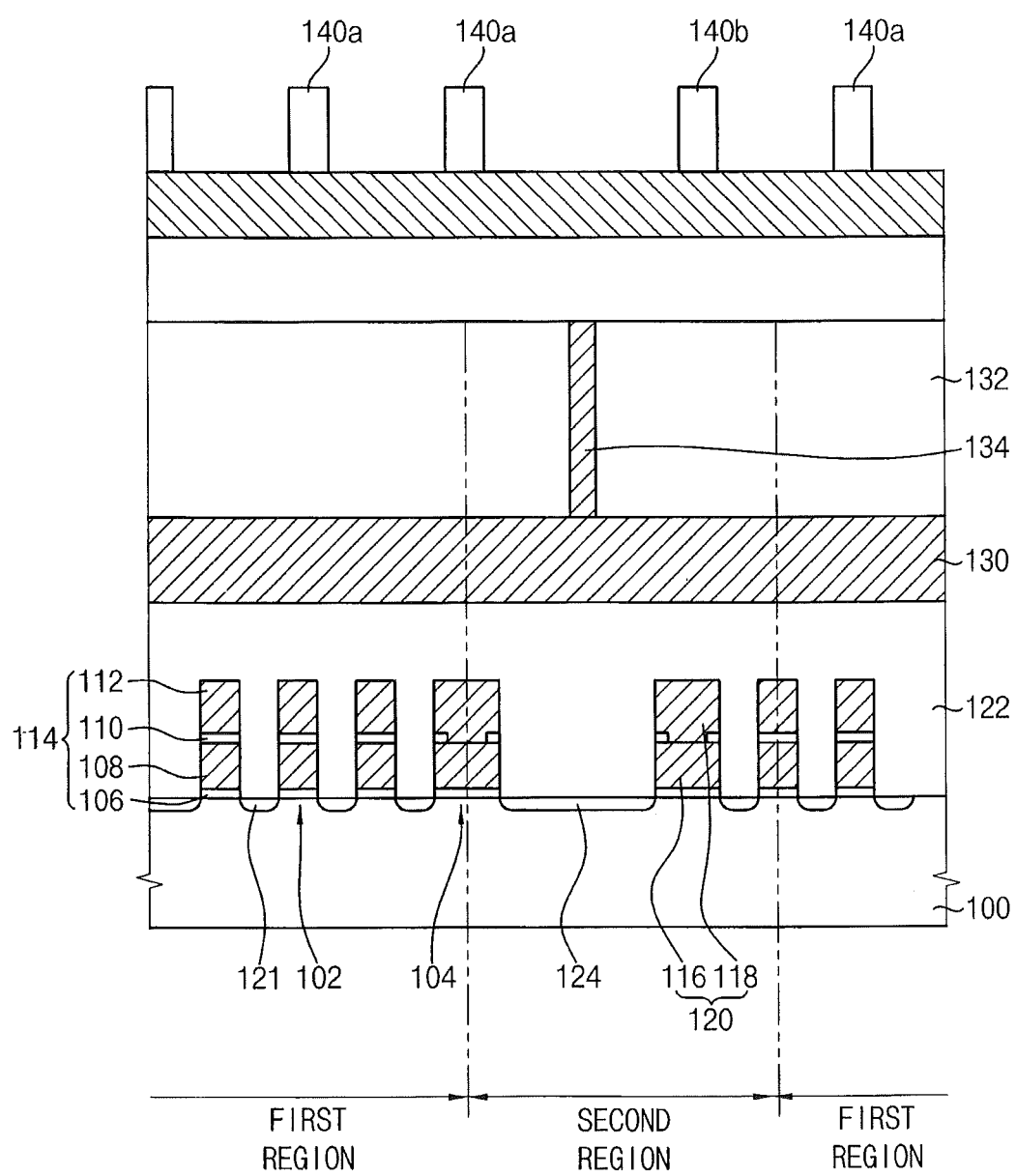
Figure 27:
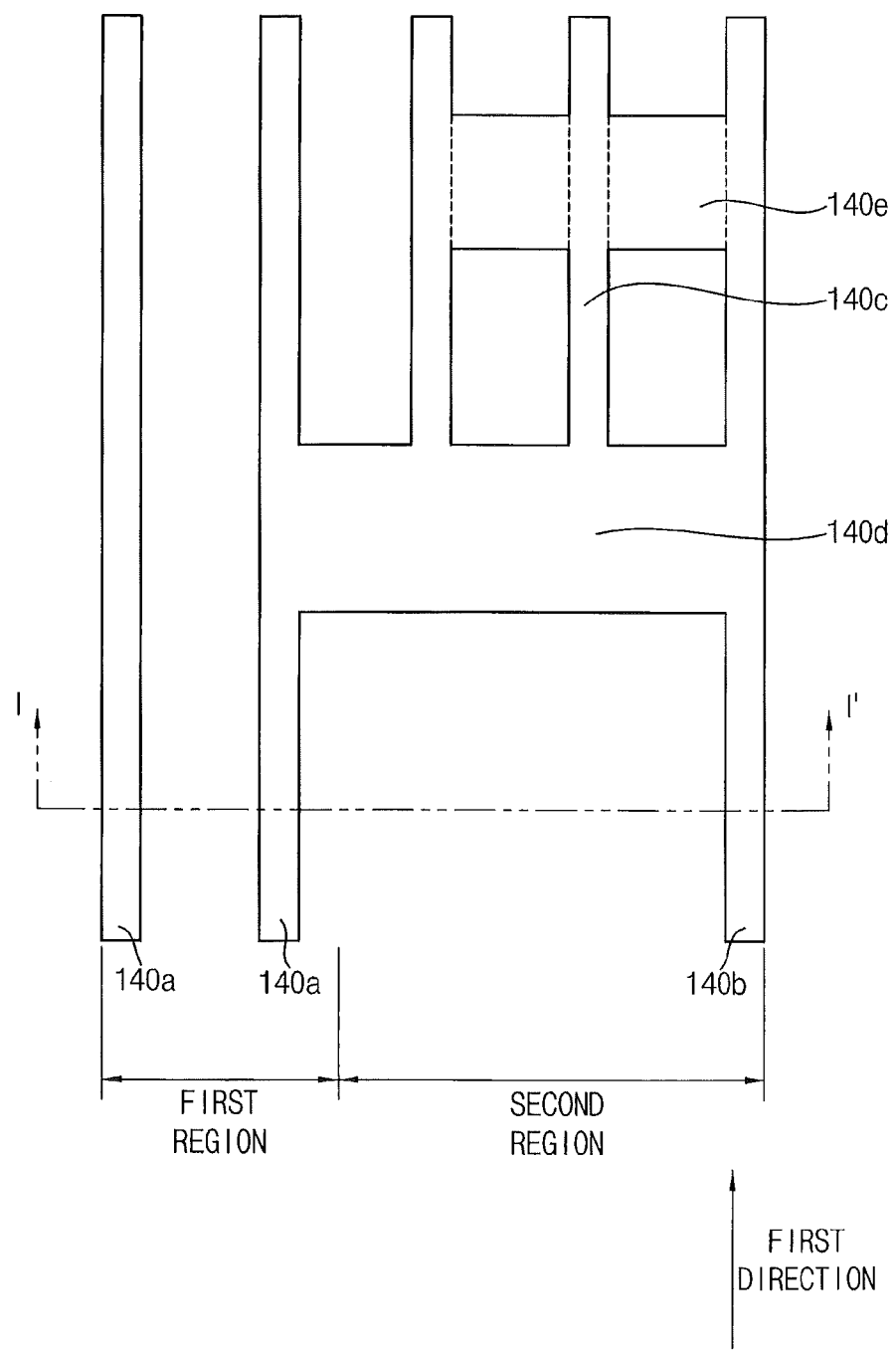

Referring to FIGS. 21 and 27, first, second and third spin-on hard mask patterns 140a, 140b and 140c may be formed on the hard mask layer 138. The first to third spin-on hard mask patterns 140a~140c may have a first line width 1 F.

Particularly, the first spin-on hard mask pattern 140a extending in a first direction may be formed in the first region. A gap between the first spin-on hard mask patterns 140a may be three times the first line width, i.e., 3 F. The first spin-on hard mask pattern 140a may have a shape extending from an end portion to the other end portion of a cell block of a semiconductor device.

The second spin-on hard mask pattern 140b having a line shape extending in the first direction may be formed in the second region. A gap between one sidewall portion of the second spin-on hard mask pattern 140b and the first spin-on hard mask pattern 140a may be greater than 3 F. A gap between the other sidewall portion of the second spin-on hard mask pattern 140b and the first spin-on hard mask pattern 140a may be 3 F. The second spin-on hard mask pattern 140b may have a shape extending from an end portion to the other end portion of the cell block of the semiconductor device.

A first connecting spin-on hard mask pattern 140d for horizontally connecting the first spin-on hard mask pattern 140a and the second spin-on hard mask pattern 140b may be formed in the second region. The first connecting spin-on hard mask pattern 140d may be formed at a portion where one end portion of a second conductive pattern may be provided in a following process. The first connecting spin-on hard mask pattern 140d may have a width greater than that of the first to third spin-on hard mask patterns 140a~140c.

The third spin-on hard mask pattern 140c may be formed between the first and second hard mask patterns 140a and 140b in the second region. The third spin-on hard mask pattern 140c may be provided at a position where a second dummy conductive pattern may be formed in a following process. In this case, the third spin-on hard mask pattern 140c may not be formed at a position where the second conductive pattern may be formed in a following process. The third spin-on hard mask patterns 140c may be spaced apart by 3 F from each other. The third spin-on hard mask pattern 140c may be connected with the first connecting spin-on hard mask pattern 140d.

A second connecting spin-on hard mask pattern 140e for horizontally connecting the third spin-on hard mask pattern 140c and the second spin-on hard mask pattern 140b may be formed in the second region. The second connecting spin-on hard mask pattern 140e may have a greater width than that of the first to third spin-on hard mask patterns 140a~140c.

Figure 22:
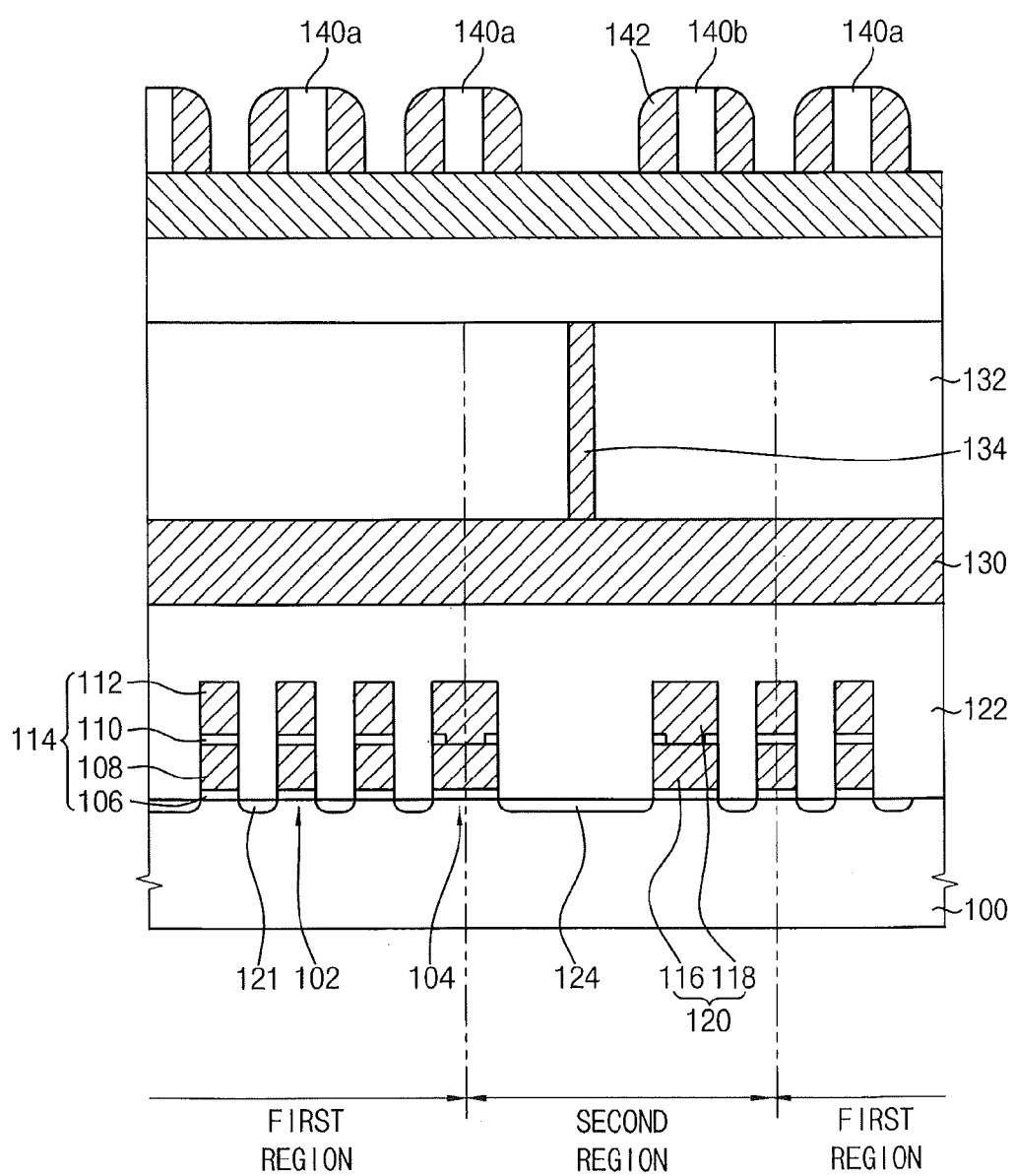
Figure 28:
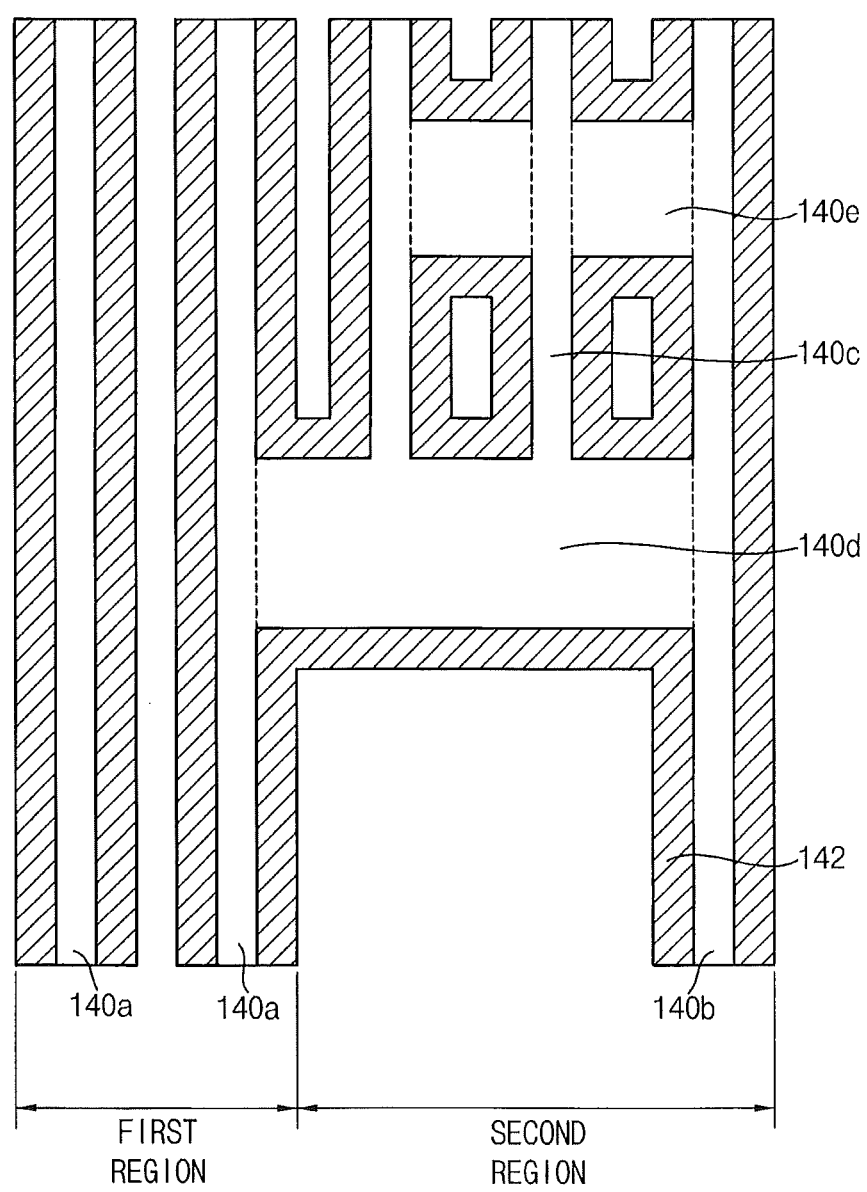

Referring to FIGS. 22 and 28, a spacer layer may be formed along surface portions of the first to third spin-on hard mask patterns 140a~140c, the first and second connecting spin-on hard mask patterns 140d and 140e and the hard mask layer 138. The spacer layer may be formed to have the same line width as the first to third spin-on hard mask patterns 140a~140c.

The spacer layer may be anisotropically etched to form a spacer 142 on sidewall portions of the first to third spin-on hard mask patterns 140a~140c and the first and second spin-on hard mask patterns 140d and 140e. The spacer 142 may have the same line width as that of the first to third spin-on hard mask patterns 140a~140c.

Figure 23:
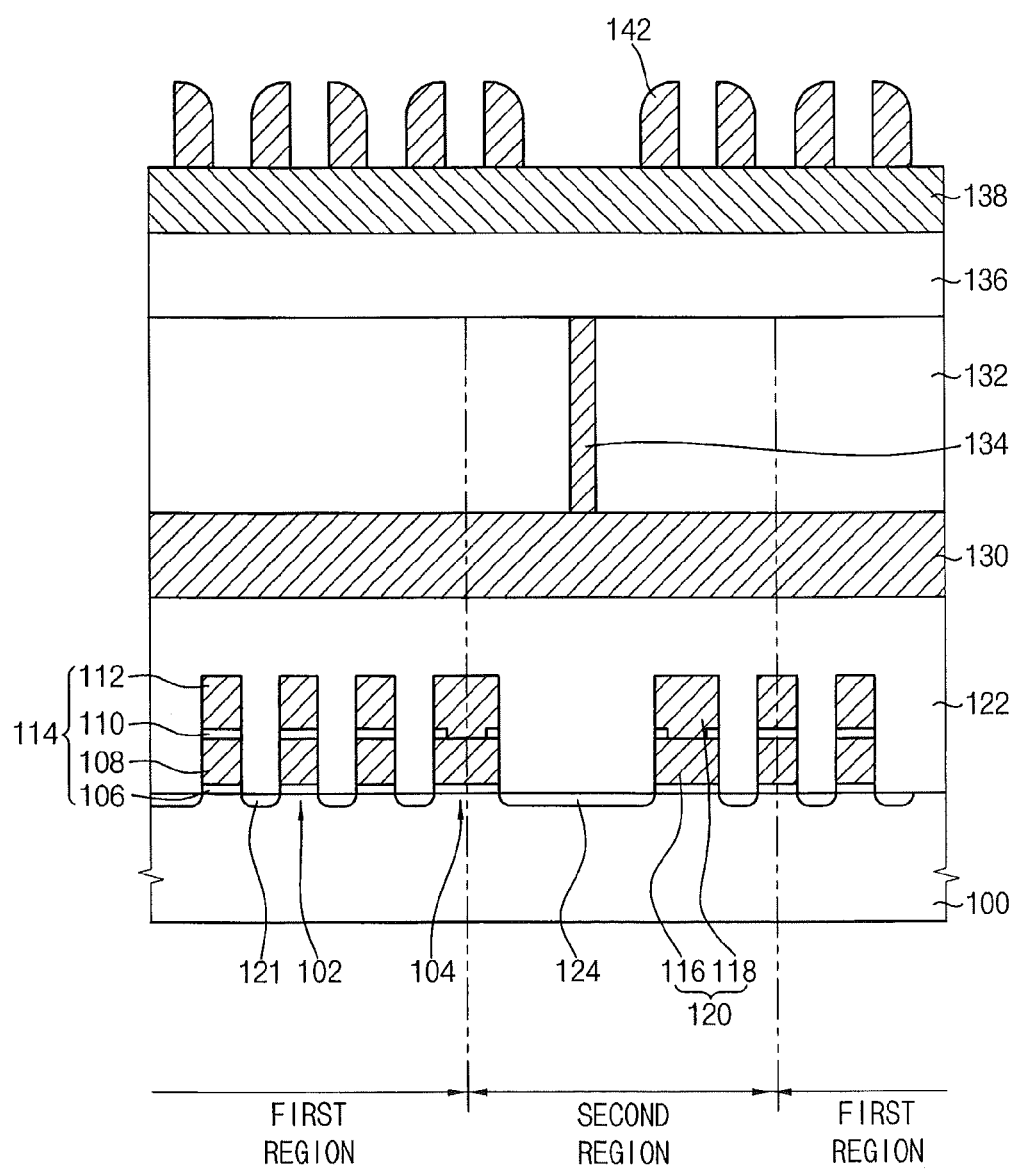
Figure 29:
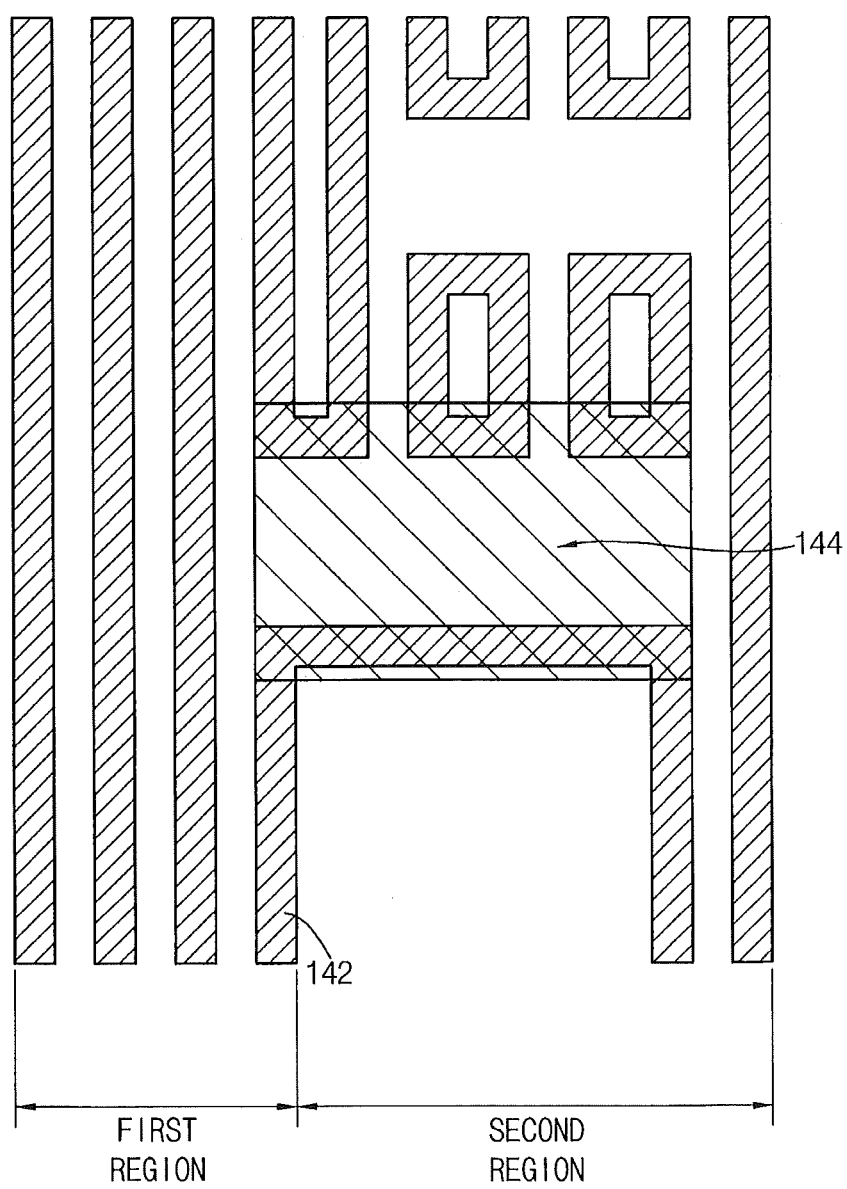

Referring to FIGS. 23 and 29, the first to third spin-on hard mask patterns 140a~140c and the first and second connecting spin-on hard mask patterns 140d and 140e may be removed. Only the spacer 142 may remain on the hard mask layer 138. The spacer 142 may be used as an etching mask in a following process.

A photoresist layer covering the spacer 142 may be formed on the hard mask layer 138 and then, patterned to form a photoresist pattern. The photoresist pattern portion and the spacer 142 portion may be used as etching masks for forming a hard mask pattern.

Figure 24:
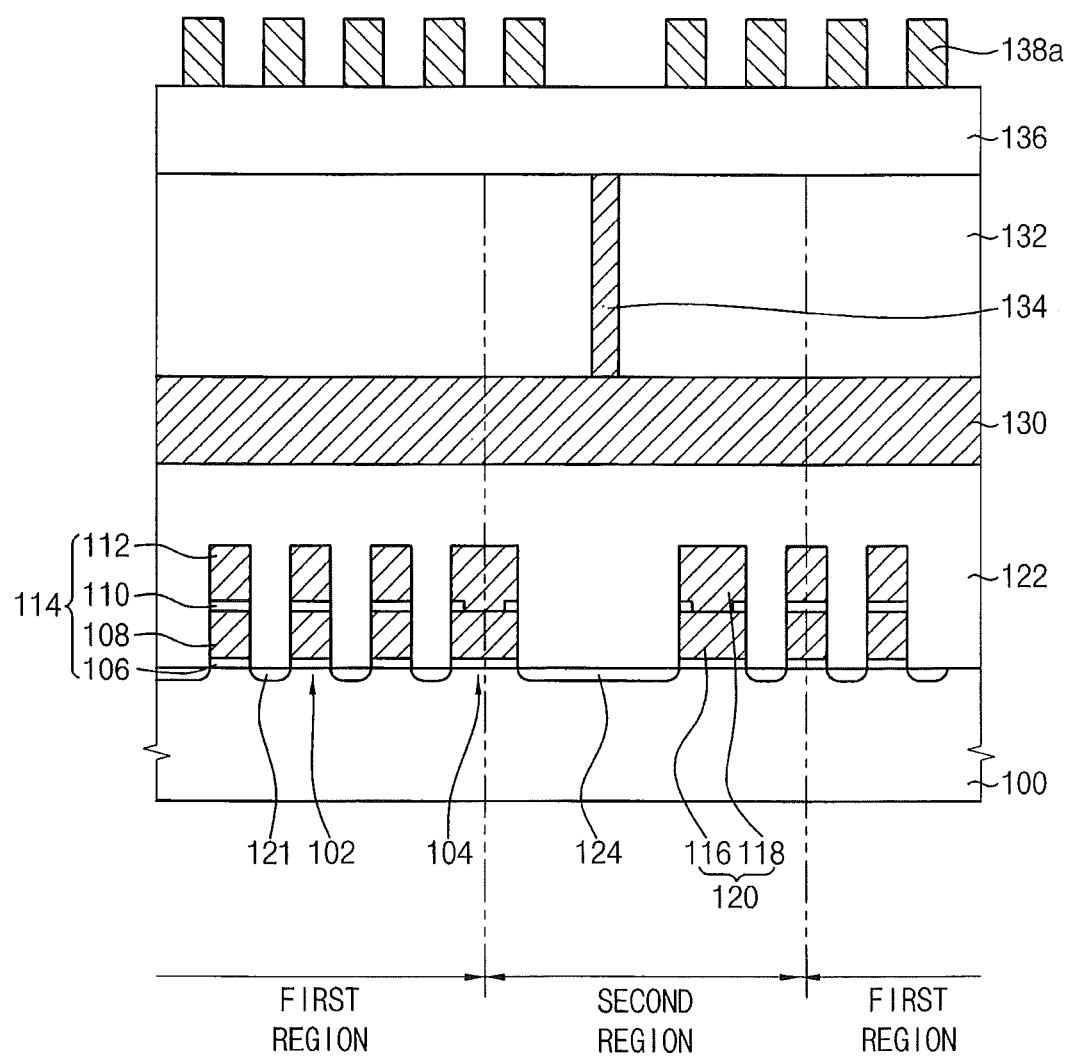
Figure 30:
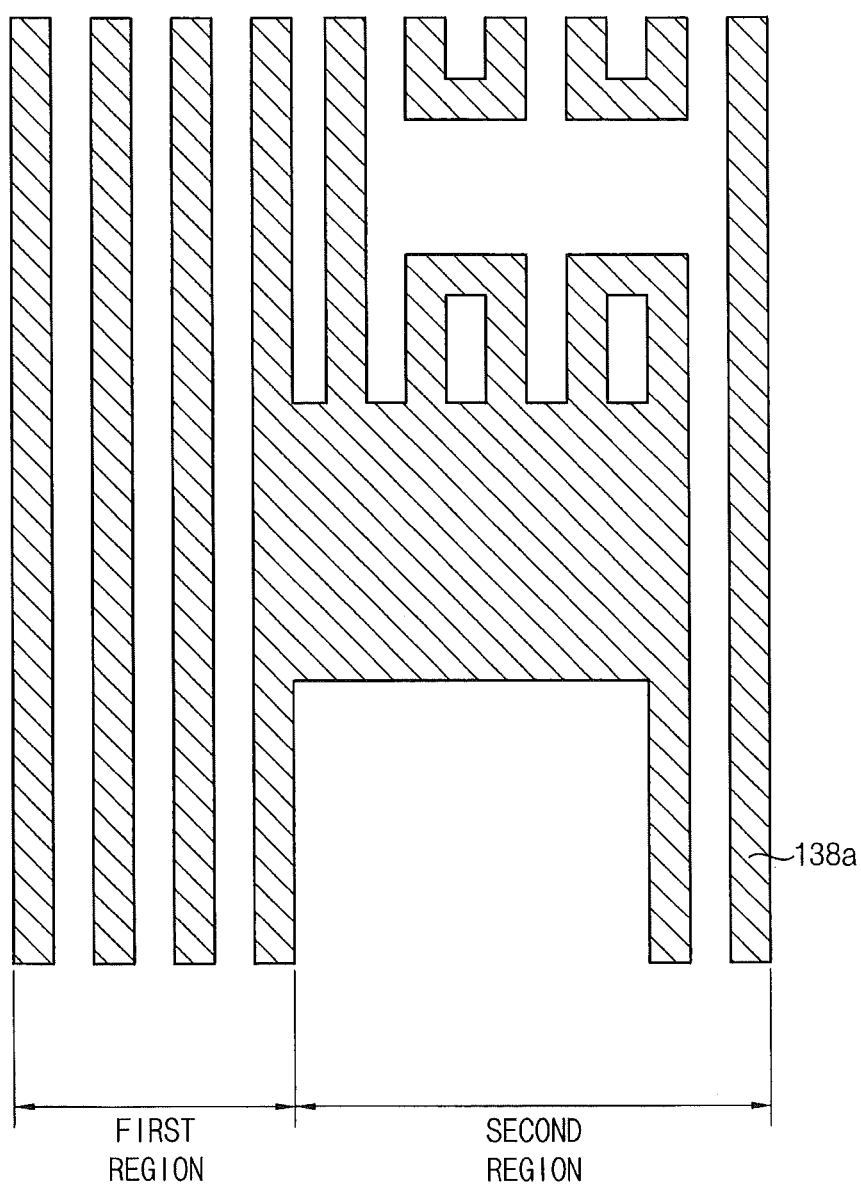

Referring to FIGS. 24 and 30, the hard mask layer 138 may be etched using the photoresist pattern and the spacer 142 as etching masks to form a hard mask pattern 138a.

Figure 25:
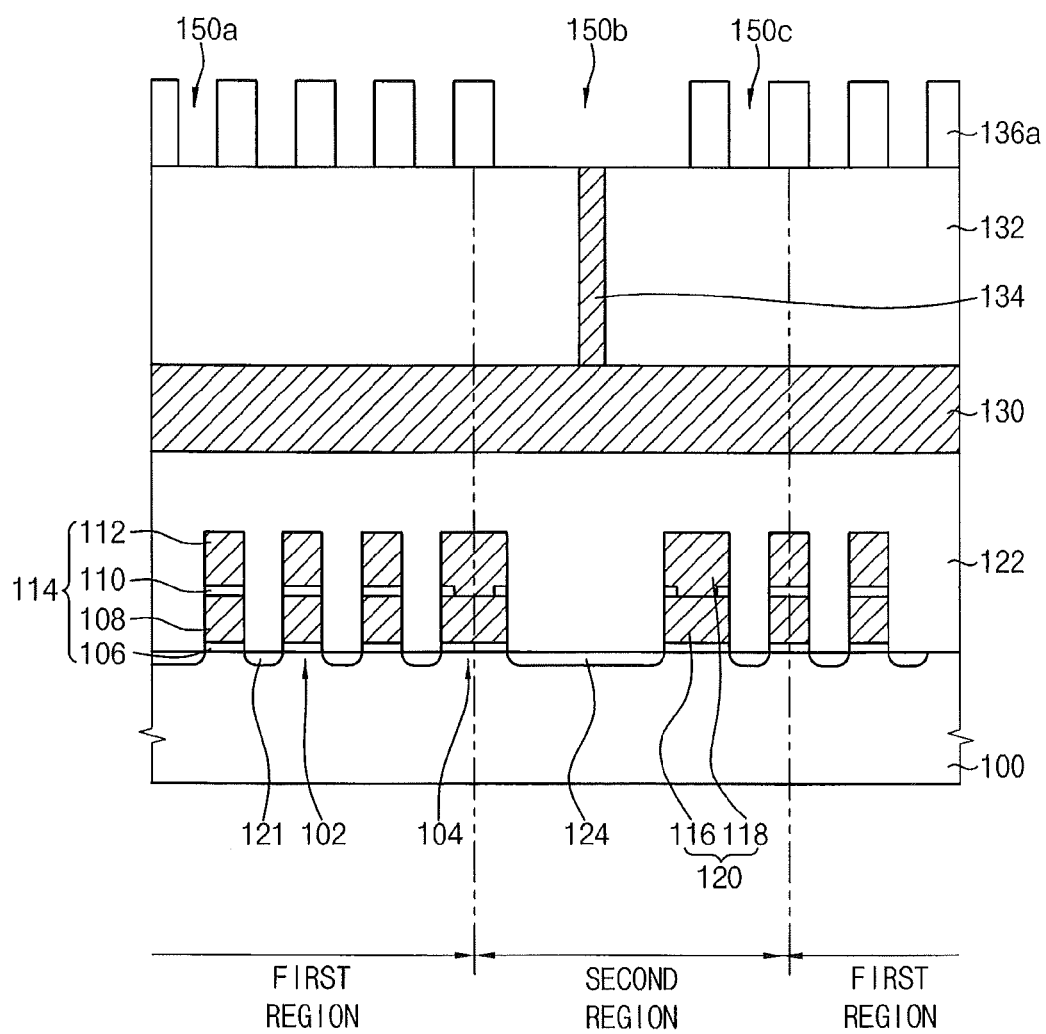
Figure 31:
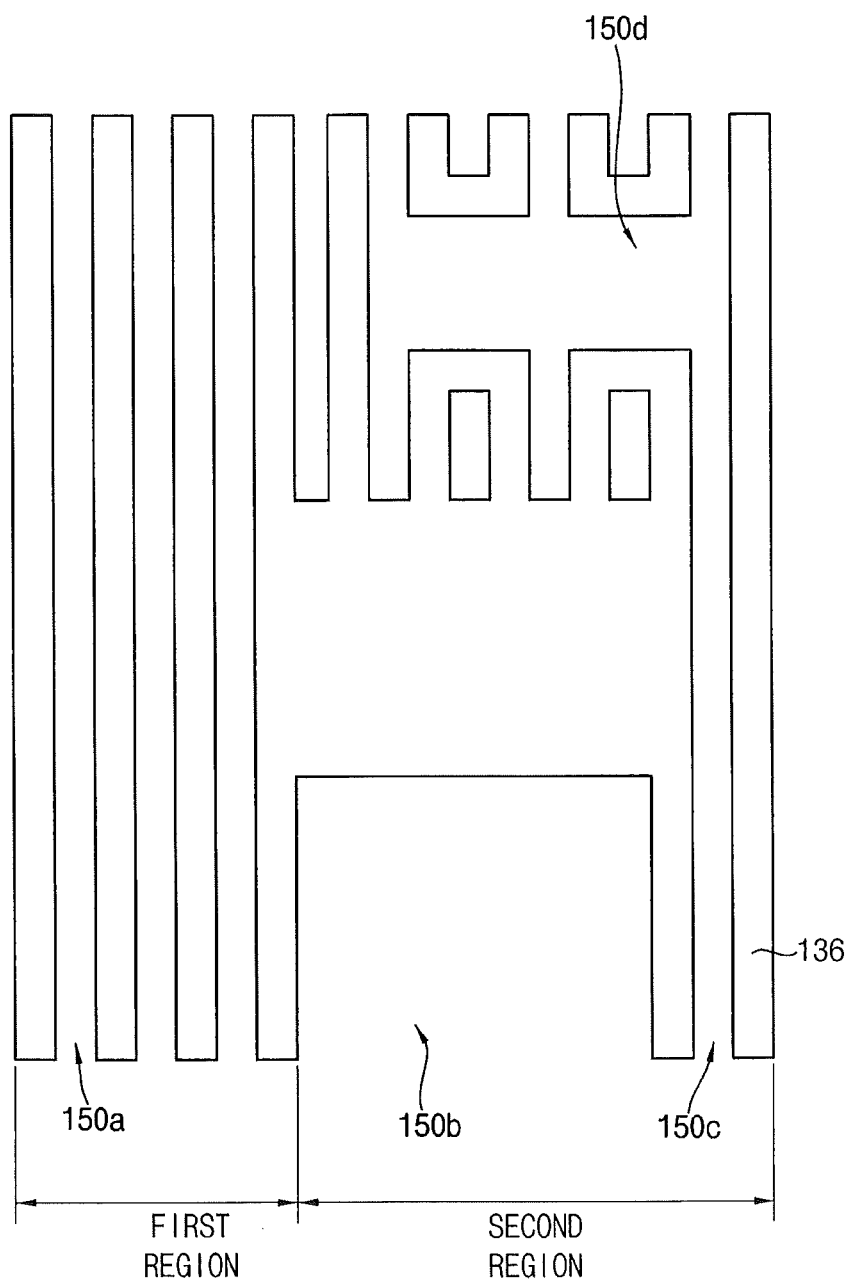

Referring to FIGS. 25 and 31, the third insulating interlayer 136 may be etched using the hard mask pattern 138a to form a third insulating interlayer pattern 136a including first, second and third trenches 150a, 150b and 150c. Within the first, second and third trenches 150a, 150b and 150c, metal wirings may be formed.

Particularly, the first trench 150a having a first line width and extending in the first direction may be formed in the first region. The second trench 150b having a second line width greater than the first line width and extending in the first direction may be formed adjacent to the first trench 150a in the second region. The third trench 150c adjacent to the second trench 150b and in parallel with the second trench 150b may be formed in the second region. The second trench 150b may be provided between the first and third trenches 150a and 150c. The third trench 150c may be connected from an end portion to the opposite end portion of a cell block. A fourth trench 150d provided in a row with the second trench 150b may be formed at another portion in the second region. The fourth trench 150d may be formed so as to penetrate a portion of a sidewall of the neighboring third trench 150c.

Figure 26:
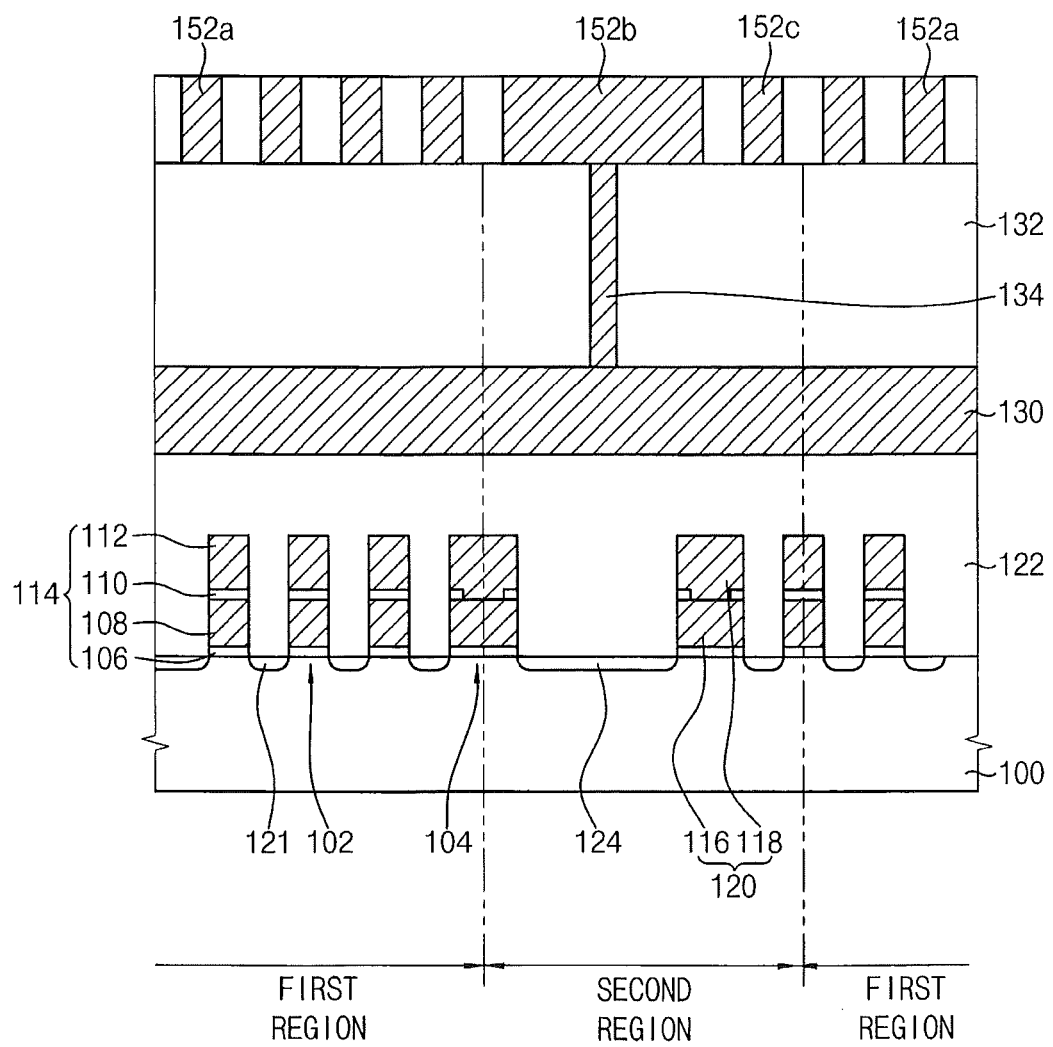
Figure 32:
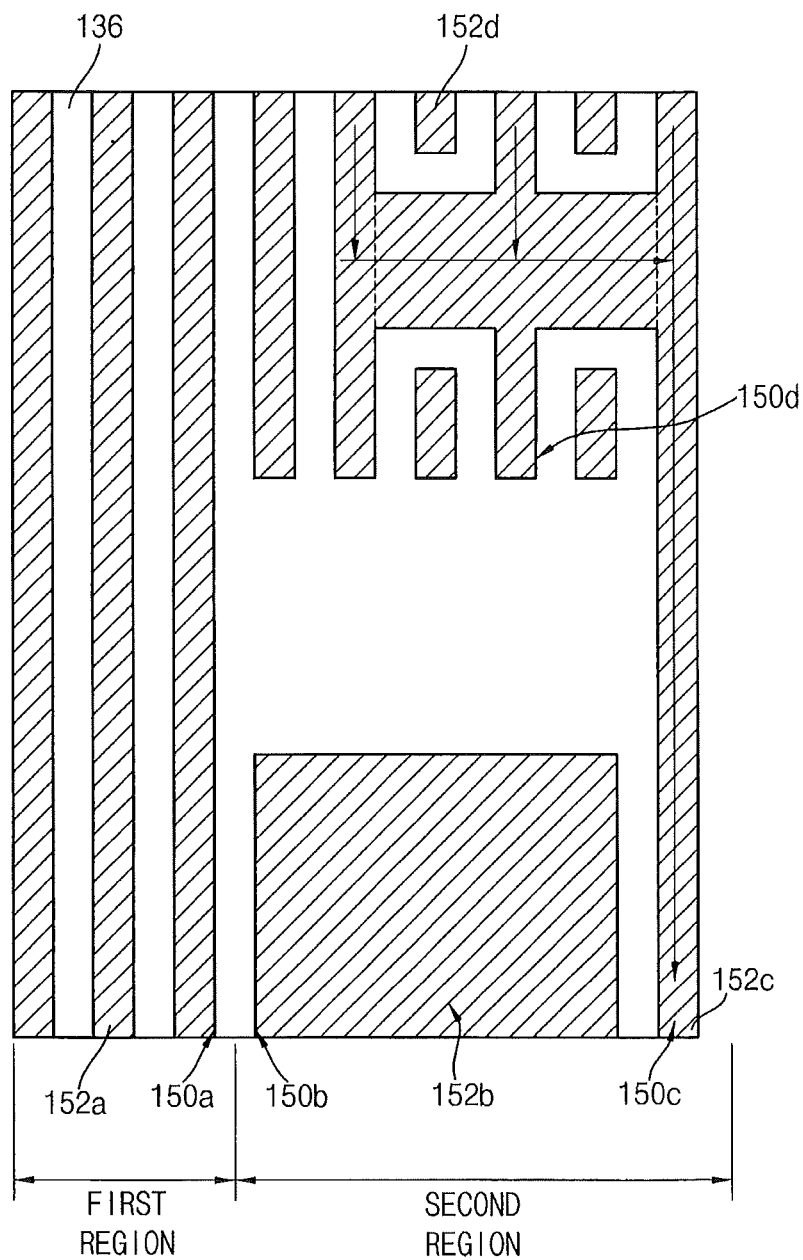

Referring to FIGS. 26 and 32, a barrier metal layer may be formed along the first to fourth trenches 150a~150d and the third insulating interlayer pattern 136a. The barrier metal layer may be formed by means of a physical vapor deposition method and/or a chemical vapor deposition method. A seed copper layer may be formed on the barrier metal layer. The seed copper layer may be formed by a physical vapor deposition method.

On the seed copper layer, a copper layer may be formed so as to fill up inner portions of the first to fourth trenches 150a~150d. The copper layer may be formed by an electroplating method.

The second trench 150b may have a line shape extending in the first direction and may be disconnected from one end portion to the other end portion of each cell block of the semiconductor device. Since the second trench 150b may not extend to the end portion of the cell block, a high electroplating current may not flow through the seed copper layer in the second trench 150b even though a voltage may be supplied to a cathode at an edge portion of a backside of the substrate 100.

Since the third trench 150c neighboring the second trench 150b may have a shape extending to the end portion of the cell block, a strong electric field may be generated through the seed copper layer formed in the third trench 150c. Thanks to the seed copper layer formed in the third trench 150c, a sufficient amount of the electroplating current may flow through the seed copper layer formed in the second trench 150b. Accordingly, a decrease of the thickness of the copper layer formed in the second trench 150b may be reduced or prevented and generation of voids in the copper layer may be restrained.

Accordingly, normal copper layers may be formed within the first to fourth trenches 150a~150d by the electroplating method.

The copper layer may be selectively removed such as by polishing, including a chemical mechanical polishing process, to expose an upper surface portion of the third insulating interlayer pattern 136a. A first conductive pattern 152a may be formed in the first trench 150a, a second conductive pattern 152b may be formed in the second trench 150b, a first dummy conductive pattern 152c may be formed in the third trench 150c and a second dummy conductive pattern 152d may be formed in the fourth trench 150d.

Particularly, the first conductive pattern 152a may be used as a signal line such as a bit line and the second conductive pattern 152b may be used as a conductive wiring for applying a voltage to a common source line. The first and second dummy conductive patterns 152c and 152d may not be used as an effective connecting wiring but may be provided for forming the connecting wirings, i.e., the first and second conductive patterns 152a and 152b normally.

Other Embodiments

Figure 33:
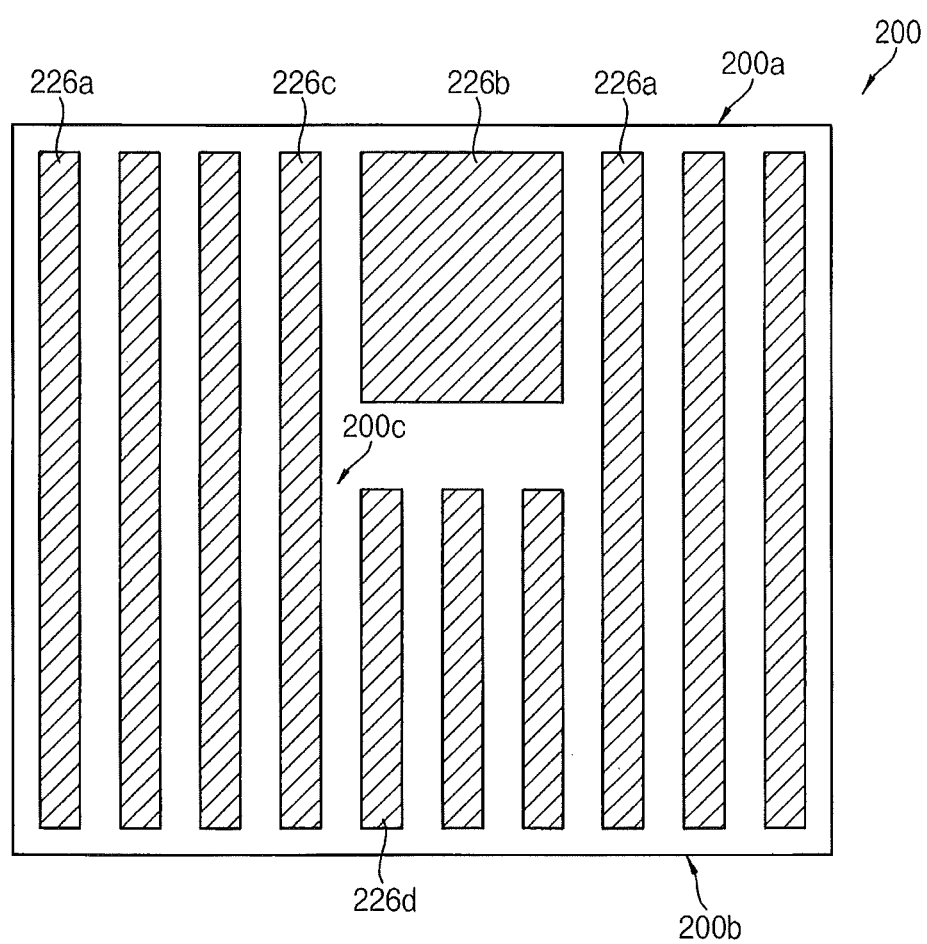
Figure 34:
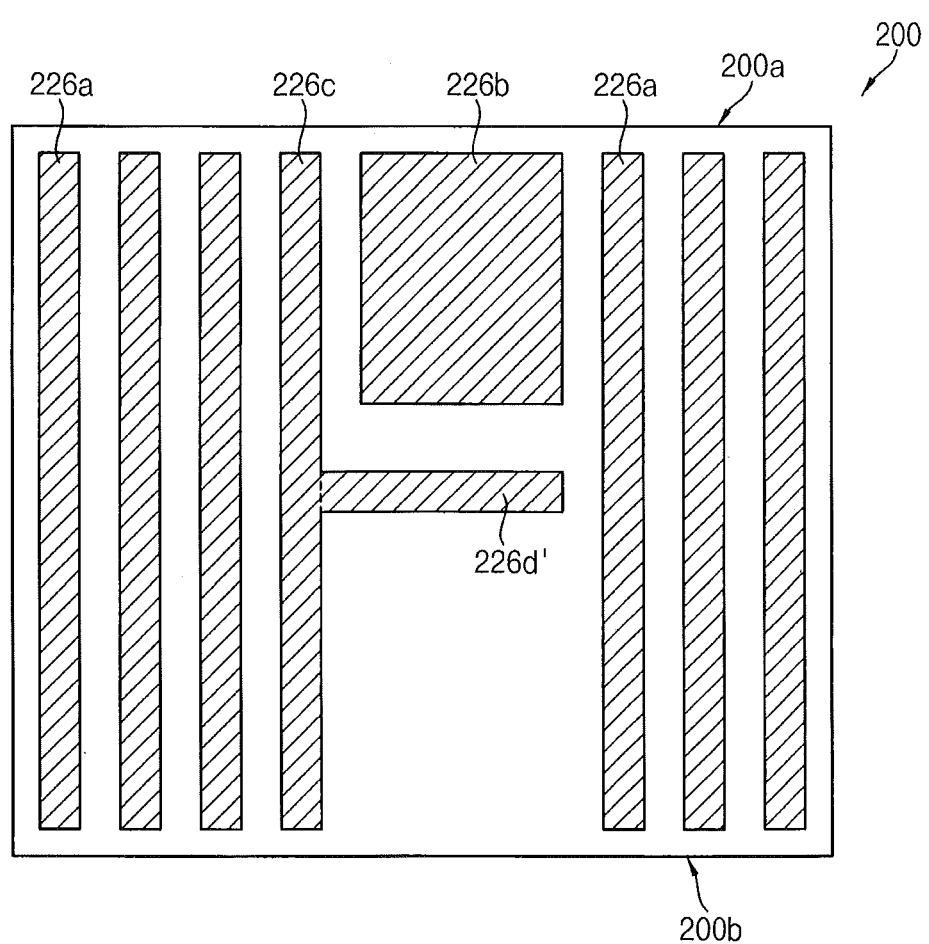
Figure 35:
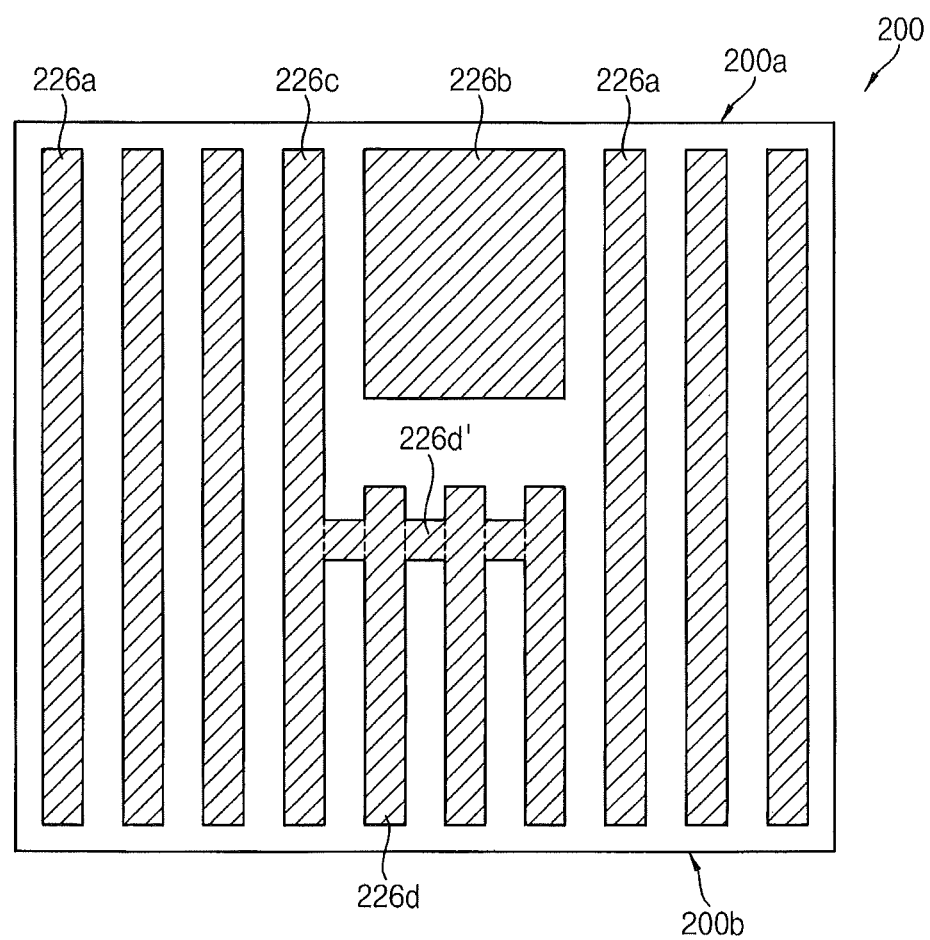

FIGS. 33 to 35 are top plan views conceptually illustrating conductive pattern structures according to various embodiments described herein. These embodiments may be fabricated according to any of the methods described above.

Specifically, referring to FIG. 33, a semiconductor device 200, such as an integrated circuit die or chip includes a plurality of closely spaced-apart signal lines 226a that extend in parallel from a first end 200a of the semiconductor device 200 to a second end 200b of the semiconductor device that is opposite the first end 200a. A reference voltage pad 226b that is wider than one of the closely spaced-apart signal lines 226a extends from the first end 200a of the semiconductor device 200 to a middle portion 200c of the semiconductor device 200, but not to the second end 200b of the semiconductor device 200. One or more dummy conductive, lines 226c is provided adjacent the reference voltage pad 226b. The dummy conductive line 226c extends from the first end 200a of the semiconductor device 200 to the second end 200b of the semiconductor device 200. As shown in FIG. 33, in some embodiments, the second dummy conductive line 226c is between the plurality of closely spaced-apart signal lines 226a and the reference voltage pad 226b Still referring to FIG. 33, the dummy conductive line 226c is a first dummy conductive line and the conductive pattern further comprises a plurality of closely spaced apart second dummy conductive lines 226d that extend in parallel from the second end 200b of the semiconductor device 200 towards the reference voltage pad 226b. In some embodiments, the signal lines 226a, the first dummy conductive line 226c and the second dummy conductive lines 226d are of same widths and have same spacing therebetween. Moreover, in some embodiments, the signal lines 226a, the reference voltage pad 226b, the first dummy conductive line 226c and the second dummy conductive line 226d comprise copper.

FIG. 34 is a top plan view of other embodiments wherein a second dummy conductive line 226d' extends orthogonally from the first dummy conductive line 226c adjacent the reference voltage pad 226b.

FIG. 35 illustrates other embodiments that combine embodiments of FIGS. 33 and 34, so that the second dummy conductive line 226d comprises a connector dummy conductive line 226d' that extends from the first dummy conductive line 226c across the second dummy conductive lines 226d. Thus, at least one of the second dummy conductive lines 226d is electrically connected to the first dummy conductive line 226c by the connector dummy conductive line 226d'.

Figure 36:
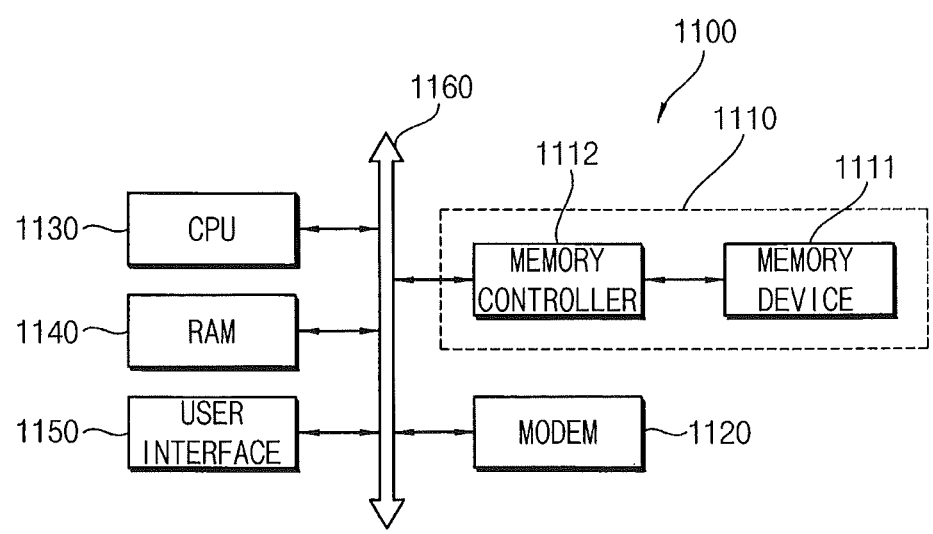

FIG. 36 illustrates a block diagram illustrating a system including a NAND flash memory in accordance with various embodiments described herein.

Referring to FIG. 36, an information processing system 1100 may include a memory device 1111 including a conductive pattern structure in accordance with various embodiments described herein. Particularly, the memory device may be a flash memory device. The memory device and a memory controller 1112 may be provided as a memory system 1110.

The information processing system 1100 may include a memory system 1110 and a modem 1120, a central processing unit (CPU) 1130, a RAM 1140 and a user interface 1150, electrically connected to each system bus 1160, respectively. In the memory system 1110, data processed by the CPU 1130 and external data may be stored. In this case, the memory system 1110 may include a semiconductor disc device (SSD) and in this case, the information processing system 110 may store stably a large amount of data in the memory system 1110. According to an increase of reliability, resources required for the memory system 1110 for correcting an error may be decreased. A fast data exchanging function may be provided with the information processing system 1100.

With the information processing system 1100 in accordance with various embodiments described herein, an application chipset, a camera image processor (CIS), a mobile DRAM, an input/output apparatus, etc. may be further provided.

As described above, a sufficient amount of an electroplating current may be provided through a whole region of a substrate in accordance with various embodiments described herein. A copper wiring having a uniform thickness and excluding voids may be formed. Various embodiments described herein may be applied to various semiconductor devices including a copper wiring.

The foregoing is illustrative of various embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A conductive pattern structure of a semiconductor device comprising:
    a plurality of closely spaced-apart signal lines that extend in parallel from a first end of the semiconductor device to a second end of the semiconductor device that is opposite the first end;
    a reference voltage pad that is wider than one of the closely spaced-apart signal lines and that extends from the first end of the semiconductor device to a middle portion of the semiconductor device but not to the second end of the semiconductor device; and
    a dummy conductive line adjacent the reference voltage pad and that extends from the first end of the semiconductor device to the second end of the semiconductor device.

2. The conductive pattern structure of claim 1 wherein the dummy conductive line is a first dummy conductive line, the conductive pattern structure further comprising:
    a plurality of closely spaced-apart second dummy conductive lines that extend in parallel from the second end of the semiconductor device towards the reference voltage pad.

3. The conductive pattern structure of claim 2 wherein at least one of the second dummy conductive lines is electrically connected to the first dummy conductive line.

4. The conductive pattern structure of claim 1 wherein the dummy conductive line is between the plurality of closely spaced-apart signal lines and the reference voltage pad.

5. The conductive pattern structure of claim 2 wherein the signal lines, the first dummy conductive line and the second dummy conductive lines are of equal widths and are equally spaced apart.

6. The conductive pattern structure of claim 2 further comprising a connector dummy conductive line that extends from the first dummy conductive line across the second dummy conductive lines.

7. The conductive pattern structure of claim 2 wherein the signal lines, reference voltage pad, the first dummy conductive line and the second dummy conductive lines comprise copper.

8. The conductive pattern structure of claim 1 wherein the dummy conductive line is a first dummy conductive line, the conductive pattern structure further comprising:
    a second dummy conductive line that extends orthogonally from the first dummy conductive line adjacent the reference voltage pad.

* * * * *